(12) United States Patent
Lee et al.

(10) Patent No.: US 12,199,129 B2
(45) Date of Patent: Jan. 14, 2025

(54) IMAGE SENSORS INTEGRATED WITH INFRARED SENSORS AND ELECTRONIC DEVICES INCLUDING THE SAME

(71) Applicant: Samsung Electronics Co., Ltd., Suwon-si (KR)

(72) Inventors: Minhyun Lee, Suwon-si (KR); Minsu Seol, Seoul (KR); Hyeonjin Shin, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 514 days.

(21) Appl. No.: 17/313,464

(22) Filed: May 6, 2021

(65) Prior Publication Data

US 2021/0375977 A1    Dec. 2, 2021

(30) Foreign Application Priority Data

May 27, 2020    (KR) ........................ 10-2020-0063888

(51) Int. Cl.
*H01L 27/146*    (2006.01)
*H04N 23/11*    (2023.01)

(52) U.S. Cl.
CPC .. *H01L 27/14649* (2013.01); *H01L 27/14636* (2013.01); *H04N 23/11* (2023.01)

(58) Field of Classification Search
CPC ..................................... H01L 27/14645–14663
See application file for complete search history.

(56) References Cited

U.S. PATENT DOCUMENTS

2011/0260059 A1*   10/2011   Jiang ................ H01L 27/14649
                                                    257/E27.15
2015/0054962 A1    2/2015   Borthakur et al.
(Continued)

FOREIGN PATENT DOCUMENTS

JP    2016-076682 A    5/2016
KR    10-0905269 B1    6/2009
(Continued)

OTHER PUBLICATIONS

"Digital Transitions Photo, bsi-1," Web page <https://www.photo-digitaltransitions.com/bsi-sensors-demystified/bsi-1/#main>, Aug. 27, 2018, retrieved Jun. 23, 2021.
(Continued)

*Primary Examiner* — Tucker J Wright
(74) *Attorney, Agent, or Firm* — Harness, Dickey & Pierce, P.L.C.

(57) ABSTRACT

An image sensor includes a visible light sensor portion and an infrared sensor portion arranged on the visible light sensor portion. The visible light sensor portion includes a first sensor layer and a first signal wiring layer, wherein a plurality of visible light sensing elements are arrayed in the first sensor layer and the first signal wiring layer is configured to process a signal output from the first sensor layer. The infrared sensor portion includes a second sensor layer in which a plurality of infrared sensing elements are arrayed, and a second signal wiring layer configured to process a signal output from the second sensor layer. The infrared sensor portion and the visible light sensor portion form a single monolithic structure which is effective in obtaining high resolution.

23 Claims, 22 Drawing Sheets

(56) References Cited

U.S. PATENT DOCUMENTS

| 2015/0381907 A1 | 12/2015 | Boettiger et al. | |
|---|---|---|---|
| 2019/0096932 A1 | 3/2019 | Hseih et al. | |
| 2021/0250480 A1* | 8/2021 | Lee | H04N 23/45 |
| 2021/0302236 A1* | 9/2021 | Takahashi | G01J 5/22 |

FOREIGN PATENT DOCUMENTS

| KR | 2012-0029527 A | 3/2012 |
|---|---|---|
| KR | 2012-0038431 A | 4/2012 |
| KR | 2014-0009774 A | 1/2014 |
| KR | 2019-0080174 A | 7/2019 |

OTHER PUBLICATIONS

"Midopt, DB475/850 Dual Bandpass Blue + 850nm NIR," Web page <https://midopt.com/filters/db475850/>, retrieved Jun. 23, 2021.
"Midopt, DB550/850 Dual Bandpass Green + 850nm NIR," Web page <https://midopt.com/filters/db550850/>, retrieved Jun. 23, 2021.
"Midopt, DB660/850 Dual Bandpass Red + 850nm NIR," Web page <https://midopt.com/filters/db660850/>, retrieved Jun. 23, 2021.
"Bandpass Visible Filters," Web page <https://maxmax.com/filters/bandpass-visible-b>, retrieved Jun. 23, 2021.
"RGB+IR Technology, Understanding the Benefits of RBG+IR Sensors, FRAMOS," Web page <https://www.framos.com/media/pdf/94/d6/a4/RGB-IR-EN-WEB.pdf>, retrieved Jun. 23, 2021.
"Absorption Coefficient," Web page <https://www.pveducation.org/pvcdrom/pn-junctions/absorption-coefficient>, retrieved Jun. 23, 2021.
"Get the Big Picture: CMOS Image Sensors and ISOCELL," Web page <https://news.samsung.com/global/get-the-big-picture-cmos-image-sensors-and-isocell>, Feb. 26, 2014, retrieved Jun. 23, 2021.
"CMOS Image Sensor Design Technology Status and Prospect," The Magazine of the IEEK, Jun. 2013, pp. 599-611, and English-language translation regarding FIG. 7(a), FIG. 7(b), and FIG. 8 thereof.
Extended European Search Report dated Oct. 25, 2021 for corresponding European Application No. 21175681.2.

* cited by examiner

IMAGE SENSORS INTEGRATED WITH INFRARED SENSORS AND ELECTRONIC DEVICES INCLUDING THE SAME

CROSS-REFERENCE TO RELATED APPLICATION

This application claims the benefit of Korean Patent Application No. 10-2020-0063888, filed on May 27, 2020, in the Korean Intellectual Property Office, the disclosure of which is incorporated herein in its entirety by reference.

BACKGROUND

1. Field

The present disclosure relates to image sensors integrated with infrared sensors, and electronic devices including the image sensors.

2. Description of Related Art

The use of optical imaging apparatuses, for example, digital cameras including solid-state imaging devices such as a charge coupled device (CCD) or a complementary metal-oxide semiconductor (CMOS) device configured to convert optical images into electrical signals, has been rapidly widespread.

Recently, along with the development of 3D display devices and increasing demand for 3D display devices, various techniques have been studied to provide depth information together with color information.

SUMMARY

Provided are image sensors in which an infrared sensor and a visible light sensor are integrated with each other to form a single (e.g., substrate-based) monolithic structure, said image sensors enabling a structure for detecting infrared rays while maintaining the resolution of a color image sensor. Such images sensors may integrate infrared sensors into RGB CMOS image sensors for obtaining 3D image information, and may provide improved image resolution of the RGB CMOS image sensors, for example in relation to image sensors where a sensor area is divided into color pixels and infrared pixels.

Provided are electronic devices including the image sensors.

Provided are methods of manufacturing the image sensors.

Additional aspects will be set forth in part in the description which follows and, in part, will be apparent from the description, or may be learned by practice of some example embodiments of the disclosure.

According to some example embodiments, an image sensor may include a visible light sensor including a first sensor layer and a first signal wiring layer, wherein a plurality of visible light sensing elements are arrayed in the first sensor layer and the first signal wiring layer is configured to process a signal output from the first sensor layer; and an infrared sensor on the visible light sensor, the infrared sensor including a second sensor layer and a second signal wiring layer, wherein a plurality of infrared sensing elements are arrayed in the second sensor layer, and the second signal wiring layer is configured to process a signal output from the second sensor layer, wherein the infrared sensor and the visible light sensor form a single (e.g., substrate-based) monolithic structure.

The visible light sensor and the infrared sensor may be arranged such that incident light may enter the second sensor layer after passing through the first sensor layer.

The visible light sensor may be arranged such that incident light may enter the first sensor layer before reaching the first signal wiring layer.

The infrared sensor may be arranged such that incident light may enter the second sensor layer after passing through the second signal wiring layer.

The infrared sensor may be arranged such that incident light may enter the second sensor layer before reaching the second signal wiring layer.

The visible light sensor may be arranged such that incident light may enter the first sensor layer after passing through the first signal wiring layer.

The infrared sensor may be arranged such that incident light may enter the second sensor layer after passing through the second signal wiring layer.

The infrared sensor may be arranged such that incident light may enter the second sensor layer before reaching the second signal wiring layer.

The first signal wiring layer may include a first wiring pattern including first conductive elements, the first signal wiring layer may include a first (e.g., high-density) region in which a first portion of the first conductive elements are arranged in a first (e.g., relatively high) arrangement density and a second (e.g., low-density) region in which a second portion of the first conductive elements are arranged in a second (e.g., relatively low) arrangement density, the second density being lower than the first density, and in the first wiring pattern of the first signal wiring layer, the high-density region may vertically overlap with an adjacent region between adjacent visible light sensing elements of the plurality of visible light sensing elements.

The second signal wiring layer may include a second wiring pattern including second conductive elements, the second signal wiring layer may include a high-density region in which a first portion of the second conductive elements are arranged in a third (e.g., relatively high) density and a low-density region in which a second portion of the second conductive elements are arranged in a fourth (e.g., relatively low) density, and in the second wiring pattern of the second signal wiring layer, the high-density region of the second signal wiring layer may vertically overlap with the high-density region of the first signal wiring layer.

A filter array may be provided on the visible light sensor, and the filter array may include first filters configured to selectively transmit red light and infrared light, second filters configured to selectively transmit green light and infrared light, and third filters configured to selectively transmit blue light and infrared light.

Each filter of the first filters, the second filters, and the third filters may vertically overlap a separate one visible light sensing element of the plurality of visible light sensing elements, and the first, second, and third filters may define a plurality of subpixels.

The plurality of infrared sensing elements may be arranged such that the plurality of infrared sensing elements may vertically overlap the plurality of subpixels in a one-to-one manner.

The plurality of subpixels may be arranged in such a manner that a red subpixel, a green subpixel, and a blue subpixel may form one unit pixel.

The plurality of infrared sensing elements may be arranged such that one infrared sensing element of the plurality of infrared sensing elements vertically overlaps the one unit pixel.

The plurality of subpixels may be arranged in such a manner that four quadrant regions of one unit pixel may be a red subpixel, a first green subpixel, a blue subpixel, and a second green subpixel, respectively.

The plurality of infrared sensing elements may be arranged in such a manner that one infrared sensing element vertically overlaps one unit pixel.

According to an aspect of some example embodiments, an electronic device includes: the image sensor configured to absorb incident light reflected from an object and output a signal based on the absorbing; and processing circuitry configured to generate an image of the object based on processing the signal output from the image sensor.

The incident light reflected from the object may include infrared incident light and visible incident light, the visible light sensor may be configured to output a visible light signal based on absorbing the visible incident light, the infrared sensor may be configured to output an infrared light signal based on absorbing the infrared incident light, and the processing circuitry may be further configured to calculate depth information associated with the object based on processing the infrared light signal and combine the depth information with visible light image information about the object that is determined based on processing the visible light signal to generate a 3D image of the object.

The processing circuitry may be further configured to calculate a temperature or moisture distribution of the object from a signal output based on processing the infrared light signal.

According to an aspect of some example embodiments, there is provided a method of manufacturing an image sensor, the method including: forming a plurality of visible light sensing elements within a semiconductor substrate; forming a first signal wiring layer on a surface of the semiconductor substrate, the first signal wiring layer being configured to process signals output from the plurality of visible light sensing elements; forming an infrared sensor on the first signal wiring layer; and forming a bandpass filter on a rear surface of the semiconductor substrate, the rear surface being opposite to the surface of the semiconductor substrate.

The forming of the infrared sensor may be performed in a series of continuous processes with respect to the semiconductor substrate.

The forming of the infrared sensor may be performed through a deposition process and a photolithography process without performing a bonding process.

The forming of the infrared sensor may include: forming a plurality of infrared sensing elements; and forming a second signal wiring layer configured to process signals output from the plurality of infrared sensing elements.

The forming of the first signal wiring layer may include forming a first wiring pattern including first conductive elements, the first signal wiring layer may include a high-density region in which a first portion of the first conductive elements are arranged in a first density and a low-density region in which a second portion of the first conductive elements are arranged in second density, the second density being lower than the first density, and in the first wiring pattern of the first signal wiring layer, the high-density region vertically overlaps with an adjacent region between adjacent visible light sensing elements of the plurality of visible light sensing elements.

The forming of the second signal wiring layer may include forming a second wiring pattern including second conductive elements, the second signal wiring layer may include a high-density region in which a first portion of the second conductive elements are arranged in a third density and a low-density region in which a second portion of the second conductive elements are arranged in fourth density, the fourth density being lower than the third density, and in the second wiring pattern of the second signal wiring layer, the high-density region of the second signal wiring layer may vertically overlap with the high-density region of the first signal wiring layer.

According to some example embodiments, an image sensor may include a visible light sensor and an infrared sensor on the visible light sensor. The visible light sensor may include a first sensor layer and a first signal wiring layer, wherein a visible light sensing element is in the first sensor layer and the first signal wiring layer is configured to process a signal output from the visible light sensing element based on the visible light sensing element absorbing visible incident light. The infrared sensor may include a second sensor layer and a second signal wiring layer, wherein an infrared sensing element is in the second signal wiring layer, and the second signal wiring layer is configured to process a signal output from the infrared sensing element based on the infrared sensing element absorbing infrared incident light. The infrared sensor and the visible light sensor may form a single (e.g., substrate-based) monolithic structure.

The visible light sensor and the infrared sensor may be arranged such that incident light enters the second sensor layer after passing through the first sensor layer.

The visible light sensor may be arranged such that incident light enters the first sensor layer before reaching the first signal wiring layer.

The infrared sensor may be arranged such that incident light enters the second sensor layer after passing through the second signal wiring layer.

The infrared sensor may be arranged such that incident light enters the second sensor layer before reaching the second signal wiring layer.

The visible light sensor may be arranged such that incident light enters the first sensor layer after passing through the first signal wiring layer.

The infrared sensor may be arranged such that incident light enters the second sensor layer after passing through the second signal wiring layer.

The infrared sensor may be arranged such that incident light enters the second sensor layer before reaching the second signal wiring layer.

A plurality of visible light sensing elements may be arrayed in the first sensor layer, the plurality of visible light sensing elements including the visible light sensing element. The plurality of visible light sensing elements may be configured to detect different wavelengths of visible light.

A plurality of infrared sensing elements may be arrayed in the second sensor layer, the plurality of infrared sensing elements including the infrared sensing element. The plurality of infrared sensing elements may be configured to detect different wavelengths of infrared light.

BRIEF DESCRIPTION OF THE DRAWINGS

The above and other aspects, features, and advantages of some example embodiments of the disclosure will be more apparent from the following description taken in conjunction with the accompanying drawings, in which.

DETAILED DESCRIPTION

Figure 1:
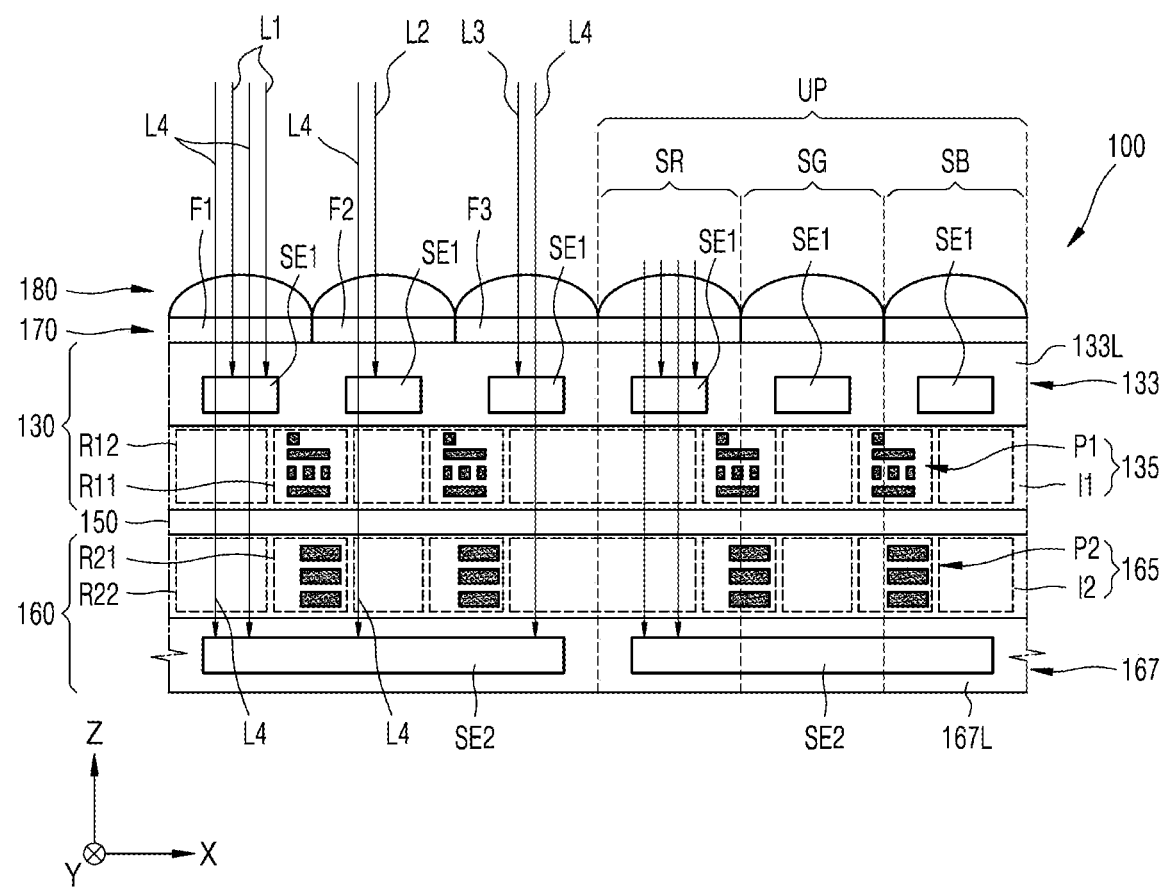
FIG. 1 is a cross-sectional view illustrating a schematic configuration of an image sensor according to some example embodiments.

Reference will now be made in detail to example embodiments, some of which are illustrated in the accompanying drawings, wherein like reference numerals refer to like elements throughout. In this regard, some example embodiments may have different forms and should not be construed as being limited to the descriptions set forth herein. Accordingly, some example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, some example embodiments will be described with reference to the accompanying drawings. The example embodiments described herein are for illustrative purposes only, and various modifications may be made therein. In the drawings, like reference numerals refer to like elements, and the sizes of elements may be exaggerated for clarity of illustration.

In the following description, when an element is referred to as being "above" or "on" another element, it may be directly on the other element while making contact with the other element or may be above the other element without making contact with the other element (e.g., indirectly on the other element), such that one or more spaces or structures interpose between the element and the other element. Also, when an element is referred to as being "on" another element, it may be above or beneath the other element.

Although the terms "first" and "second" are used to describe various elements, these terms are only used to distinguish one element from another element. These terms do not limit elements to having different materials or structures.

The terms of a singular form may include plural forms unless otherwise mentioned. It will be further understood that the terms "comprises" and/or "comprising" used herein specify the presence of stated features or elements, but do not preclude the presence or addition of one or more other features or elements.

In the present disclosure, terms such as "unit" or "module" may be used to denote a unit that has at least one function or operation and is implemented with hardware, software, or a combination of hardware and software.

An element referred to with the definite article or a demonstrative pronoun may be construed as the element or the elements even though it has a singular form.

Operations of a method may be performed in appropriate order unless explicitly described in terms of order or described to the contrary. In addition, examples or example terms (for example, "such as" and "etc.") are used for the purpose of description and are not intended to limit the scope of the inventive concepts unless defined by the claims.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%)).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%)).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "the same" as or "equal" to other elements may be "the same" as or "equal" to or "substantially the same" as or "substantially equal" to the other elements and/or properties thereof. Elements and/or properties thereof that are "substantially the same" as or "substantially equal" to other elements and/or properties thereof will be understood to include elements and/or properties thereof that are the same as or equal to the other elements and/or properties thereof within manufacturing tolerances and/or material tolerances. Elements and/or properties thereof that are the same or substantially the same as other elements and/or properties thereof may be structurally the same or substantially the same, functionally the same or substantially the same, and/or compositionally the same or substantially the same.

It will be understood that elements and/or properties thereof described herein as being the "substantially" the same encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

FIG. 1 is a cross-sectional view schematically illustrating an image sensor 100 according to some example embodiments.

The image sensor 100 includes an infrared sensor portion 160, also referred to herein interchangeably as an infrared sensor, and a visible light sensor portion 130, also referred to herein interchangeably as a visible light sensor. The infrared sensor portion 160 may be configured to detect (e.g., absorb and/or photoelectrically convert) incident infrared light reflected from an object. The visible light sensor portion 130 may be configured to detect (e.g., absorb and/or photoelectrically convert) incident visible light reflected from an object. Accordingly, an image sensor that includes a visible light sensor portion 130 and an infrared sensor portion 160 according to any of the example embodiments will be understood to be configured to detect (e.g., absorb and/or photoelectrically convert) incident light (e.g., visible and/or infrared light) reflected from an object external to the image sensor. Detecting incident light may include outputting (e.g., generating and/or transmitting) an electrical signal based on the absorbing and/or photoelectric conversion of the incident light.

The infrared sensor portion 160 and the visible light sensor portion 130 form (e.g., at least partially define, are included in, or the like) a single (e.g., substrate-based) monolithic structure. As shown in FIG. 1, the single (e.g., substrate-based) monolithic structure according to any of the example embodiments herein may further include, in addition to the infrared sensor portion 160 and the visible light sensor portion 130, one or more of the bandpass filter 150, the filter array 170, or the microlens array 180.

Here, the term "monolithic" means that the infrared sensor portion 160 and the visible light sensor portion 130 are not coupled to each other through a process such as a transfer or adhesion process, and thus the infrared sensor portion 160 and the visible light sensor portion 130 do not have respective, opposing surfaces that face each other are coupled, directly or indirectly, to each other. That is, the infrared sensor portion 160 and the visible light sensor portion 130 may be directly formed on a single substrate through a series of sequential (e.g., continuous) processes, for example, semiconductor processes such as deposition, photo-lithography, and etching processes. Deposition processes as described herein may include a chemical vapor deposition (CVD) process, an atomic layer deposition (ALD) process, or a physical vapor deposition (PVD) process such as a sputtering process. The infrared sensor portion 160 and the visible light sensor portion 130 may be formed to have a monolithically integrated structure (also referred to herein as a single, e.g., substrate-based, monolithic structure), which may be a single, continuous structure that does not include separate pieces of material coupled together, for example adhered together via a bonding pad and/or fit together using through holes extending through either or both of the infrared sensor portion 160 and/or the visible light sensor portion 130. The infrared sensor portion 160 and the visible light sensor portion 130 may be formed to have a monolithically integrated structure based on performing a series of processes on a semiconductor substrate, for example as described with reference to FIGS. 14A to 14H below.

An image sensor 100 that includes the visible light sensor portion 130 and the infrared sensor portion 160 formed to have a monolithically integrated structure may be referred to as an image sensor 100 where the visible light sensor portion 130 and the infrared sensor portion 160 form (e.g., define, are included in, etc.) a single (e.g., substrate-based) monolithic structure (also referred to herein interchangeably as a monolithic integrated structure) according to some example embodiments. Additionally, such an image sensor 100 as a whole may be a single (e.g., substrate-based) monolithic structure according to some example embodiments.

A single (e.g., substrate-based) monolithic structure, or monolithic integrated structure, may be structurally distinguished as a structure having no, or substantially no seams, joints, or coupled, opposing surfaces between separate portions of the structure that extend at least partially through an interior of the single monolithic structure. Different portions of the single (e.g., substrate-based) monolithic structure may have different material compositions and may be referred to as different layers, portions, or the like, of the structure, and devices may be included (e.g., embedded) in various portions and/or layers of the structure. But, seams, joints, and/or separate, opposing surfaces that are coupled (e.g., bonded) together may be absent between adjacent layers, portions, or the like of a single (e.g., substrate-based) monolithic structure.

Accordingly, a single (e.g., substrate-based) monolithic structure, also referred to as a monolithic integrated structure, as described herein with regarding to one or more portions of the image sensor according to any example embodiments, may be understood to include a single piece of one or more materials, layers, portions, or the like, distinguished from a non-monolithic structure that is distinguished by including multiple pieces of one or more materials layers, portions, or the like that are coupled together (e.g., bonded together), such that respective, opposing surfaces of the coupled (e.g., bonded) pieces (e.g., portions) may extend through an interior of the non-monolithic structure (e.g., in contact with each other or with one or more interposing structures and/or spaces). A non-monolithic structure may be characterized as including one or more joints, seams, or the like extending through the interior of the non-monolithic structure. A non-monolithic structure may include structures configured to enable coupling between separate pieces (e.g., portions) of one or more materials layers, portions, or the like, for example via through holes extending at least partially through one or more of said pieces and/or one or more bonding pads, adhesives, or the like at least partially located between coupled pieces. Such structures may be absent from a single (e.g., substrate-based) monolithic structure as described herein.

Because the visible light sensor portion 130 and the infrared sensor portion 160 may form a single (e.g., substrate-based) monolithic structure, the image sensor 100 may be structurally distinguished, from image sensors including an infrared sensor portion 160 and a visible light sensor portion 130 that are manufactured by separately fabricating the infrared sensor portion and the visible light sensor portion and bonding the infrared sensor portion and the visible light sensor portion to each other, by the absence in the image sensor 100 of through-holes in the visible light sensor portion 130 and/or the infrared sensor portion 160, and/or a bonding pad for alignment for coupling (e.g., bonding, adhering, etc.) the visible light sensor portion 130 and the infrared sensor portion 160 together, where said bonding pad may be located between the visible light sensor portion 130 and the infrared sensor portion 160 in image sensors including an infrared sensor portion 160 and a visible light sensor portion 130 that are manufactured by separately fabricating the infrared sensor portion and the visible light sensor portion and bonding the infrared sensor portion and the visible light sensor portion to each other.

The visible light sensor portion 130 and the infrared sensor portion 160 that form (e.g., define, are included in, etc.) a single (e.g., substrate-based) monolithic structure may be distinguished from a non-monolithic structure of coupled visible light and infrared sensor portions by virtue of not including any joints, seams, and/or coupled opposing surfaces of separate portions, layers, or the like extending through an interior of the single (e.g., substrate-based) monolithic structure.

An image sensor 100 that includes the visible light sensor portion 130 and the infrared sensor portion 160 that form (e.g., define, are included in, etc.) a single (e.g., substrate-based) monolithic structure according to some example embodiments may be configured to generate images with higher resolution in relation to image sensors including an infrared sensor portion 160 and a visible light sensor portion 130 that are manufactured by separately fabricating the infrared sensor portion and the visible light sensor portion and bonding the infrared sensor portion and the visible light sensor portion to each other (e.g., to form a non-monolithic structure), based on the image sensor 100 not including through-holes through any part of the visible light sensor portion 130 and/or the infrared sensor portion 160, and/or a bonding pad for alignment between the visible light sensor portion 130 and the infrared sensor portion 160.

Additionally, an image sensor 100 that includes the visible light sensor portion 130 and the infrared sensor portion 160 that form (e.g., define, are included in, etc.) a single (e.g., substrate-based) monolithic structure may have improved alignment (e.g., vertical overlap alignment, in the Z direction) between elements, patterns regions, or the like of the visible light sensor portion 130 and elements, patterns regions, or the like of the infrared sensor portion 160 in relation to image sensors that are manufactured by separately fabricating the infrared sensor portion and the visible light sensor portion and bonding the infrared sensor portion and the visible light sensor portion to each other (e.g., to form a non-monolithic structure). Where the visible light sensor portion 130 and the infrared sensor portion 160 are formed as part of the forming of a single (e.g., substrate-based) monolithic structure instead of being separately formed and coupled together, the alignment (e.g., of vertical overlap in the Z direction) of various elements, regions, patterns, or the like of the visible light sensor portion 130 and the infrared sensor portion 160 may be more precise and/or accurate in relation to the alignment of said elements, regions, patterns, or the like in a non-monolithic structure formed based on separately forming the visible light sensor portion 130 and the infrared sensor portion 160 and coupling them together. As a result, an image sensor 100 that includes the visible light sensor portion 130 and the infrared sensor portion 160 in a single (e.g., substrate-based) monolithic structure may be configured to enable higher-resolution image generation in relation to an image sensor that includes the visible light sensor portion 130 and the infrared sensor portion 160 as separate, pre-fabricated and/or coupled pieces, in a non-monolithic structure.

The visible light sensor portion 130 includes: a first sensor layer 133 in which a plurality of visible light sensing elements SE1 are arrayed to establish an array (e.g., a two-dimensional array) of light sensing elements SE1 within the first sensor layer 133; and a first signal wiring layer 135 including a wiring pattern P1 for processing signals output from the first sensor layer 133. The first sensor layer 133 may include a layer material 133L, which may include a silicon or a compound semiconductor, an insulating material, or the like, and the visible light sensing elements SE1 at least partially embedded within and/or covered by the layer material 133L.

Each of the visible light sensing elements SE1 is an element configured to absorb the energy of incident visible light and generate an electrical signal (e.g., a visible light signal) based on said absorbing, and may include a complementary metal-oxide semiconductor (CMOS) transistor device. The CMOS device may include a silicon semiconductor-based material. The visible light sensing elements SE1 are not limited thereto, and may include photodiodes, phototransistors, photogates, or pinned photodiodes having various configurations for detecting visible light. The visible light sensing elements SE1 may include silicon-based photodiodes.

The infrared sensor portion 160 which, as shown in FIG. 1, may be on (e.g., above or beneath) the visible light sensor portion 130, includes: a second sensor layer 167 in which a plurality of infrared sensing elements SE2 are arranged to establish an array (e.g., a two-dimensional array) of infrared sensing elements SE2 within the second sensor layer 167; and a second signal wiring layer 165 including a wiring pattern P2 for processing signals output from the second sensor layer 167. The second sensor layer 167 may include a layer material 167L, which may include a silicon or a compound semiconductor, an insulating material, or the like, and the infrared sensing elements SE2 at least partially embedded within and/or covered by the layer material 167L.

Each of the infrared sensing elements SE2 includes a photoelectric conversion material which absorbs and converts (e.g., photoelectrically converts) incident infrared light into an electrical signal (e.g., an infrared light signal) based on said absorbing. The photoelectric conversion material may include various kinds of organic materials and inorganic materials. The photoelectric conversion material may include, for example, tin phthalocyanine (SnPc), $C_{60}$, or a material in which SnPc and $C_{60}$ are mixed at a particular (or, alternatively, predetermined) ratio. Alternatively, the photoelectric conversion material may include poly_3-hexylthiophene (P3HT), phenyl-C61-butyric-acid-methyl-ester (PCBM), or a material in which P3HT and PCBM are mixed at a particular (or, alternatively, predetermined) ratio. Alternatively, the photoelectric conversion material may include BP3T, BCP, poly(3,4-ethylenedioxythiophene) (PEDOT), poly(styrene sulphonate) (PEDPT-PSS), or a squaraine dye. Each of the infrared sensing elements SE2 may include a pair of electrodes that are on opposite sides of the photoelectric conversion material and electrically coupled to the wiring pattern P2. Such electrodes may each be a transparent electrode. Herein, the transparent electrode may have a high light transmittance of greater than or equal to about 80%. The transparent electrode may include for example at least one of an oxide conductor, a carbon conductor, or a metal thin film. The oxide conductor may include for example at least one of indium tin oxide (ITO), indium zinc oxide (IZO), zinc tin oxide (ZTO), aluminum tin oxide (AlTO), or aluminum zinc oxide (AZO), the carbon conductor may include at least one of graphene or carbon nanostructures, and the metal thin film may be a very thin film including aluminum (Al), magnesium (Mg), silver (Ag), gold (Au), an alloy thereof, or a combination thereof. One of the electrodes may be a reflective electrode. Herein, the reflective electrode may have, in some example embodiments, a light transmittance of less than about 10% or high reflectance of greater than or equal to about 5%. The reflective electrode may include a reflective conductor such as a metal and may include, for example aluminum (Al), silver (Ag), gold (Au), or an alloy thereof.

In some example embodiments, the image sensor 100 may include a visible light sensor portion 130 that includes a first sensor layer 133 that includes a single visible light sensor element SE1 and/or an infrared sensor portion 160 that includes a second sensor layer 167 that includes a single infrared light sensor element SE2.

The visible light sensor portion 130 and the infrared sensor portion 160 may be arranged in the order of the visible light sensor portion 130 and the infrared sensor portion 160 along an incident light path. That is, the visible light sensor portion 130 and the infrared sensor portion 160 may be arranged such that incident light may pass through the first sensor layer 133 of the visible light sensor portion 130 and then reach (e.g., enter) the second sensor layer 167 of the infrared sensor portion 160 after passing through the first sensor layer 133 of the visible light sensor portion 130. Restated, the visible light sensor portion 130 may be proximate to a light incident side of the image sensor 100 in relation to the infrared sensor portion 160.

The arrangement order of the first sensor layer 133 and the first signal wiring layer 135 of the visible light sensor portion 130 may be determined such that incident light may first reach the first sensor layer 133 before passing through the first signal wiring layer 135. For example, in the visible light sensor portion 130 shown in FIG. 1, a first sensor layer 133 and a first signal wiring layer 135 are sequentially arranged along an incident light path such that the first sensor layer 133 is proximate to the light (e.g., L1 to L4) incident side in relation to the first signal wiring layer 135. This arrangement is commonly referred to as a backside illumination (BSI) structure.

The arrangement order of the second sensor layer 167 and the second signal wiring layer 165 of the infrared sensor portion 160 may be determined such that incident light may reach the second sensor layer 167 after passing through the second signal wiring layer 165 and after passing through the first sensor layer 133. For example, in the infrared sensor portion 160 shown in FIG. 1, a second signal wiring layer 165 and a second sensor layer 167 are sequentially arranged along an incident light path, such that the second signal wiring layer 165 is proximate to the light (e.g., L1 to L4) incident side in relation to the second sensor layer 167. This arrangement is commonly referred to as a frontside illumination (FSI) structure.

The arrangement order of the visible light sensor portion 130 and the infrared sensor portion 160, the arrangement order of the first sensor layer 133 and the first signal wiring layer 135 of the visible light sensor portion 130, and the arrangement order of the second sensor layer 167 and the second signal wiring layer 165 of the infrared sensor portion 160 are not limited to the orders illustrated in FIG. 1, but may be varied.

A filter array 170 may be arranged on the visible light sensor portion 130 (i.e., the image sensor 100 may include the filter array 170 on (e.g., directly or indirectly above) the visible light sensor portion 130 at the light (e.g., L1 to L4) incident side of the image sensor 100). The filter array 170 includes a first filter F1, a second filter F2, and a third filter F3. Each of the first filter F1, the second filter F2, and the third filter F3 is a dual bandpass filter that selectively transmits a particular (or, alternatively, predetermined) wavelength band of visible light, and an infrared wavelength band. The first filter F1 may selectively transmit red light rays L1 and infrared light rays L4 among incident light (and may selectively block wavelength bands excluding the wavelength bands of red light rays L1 and infrared light rays L4 among the incident light), the second filter F2 may selectively transmit green light rays L2 and infrared light rays L4 among incident light (and may selectively block wavelength bands excluding the wavelength bands of green light rays L2 and infrared light rays L4 among the incident light), and the third filter F3 may selectively transmit blue light rays L3 and infrared light rays L4 among the incident light (and may selectively block wavelength bands excluding the wavelength bands of blue light rays L3 and infrared light rays L4 among the incident light). The first filter F1, the second filter F2, and the third filter F3 may each face (e.g., overlap in a vertical direction, e.g., the Z direction, also referred to as vertically overlapping) a separate one visible light sensing element of the visible light sensing elements SE1, and the first filter F1, the second filter F2, and the third filter F3 may define a plurality of subpixels. As shown in FIG. 1, the plurality of sub-pixels include a red subpixel SR defined by a first filter F1, a green subpixel SG defined by a second filter F2, and a blue subpixel SB defined by a third filter F3, and the red subpixel SR, the green subpixel SG, and the blue subpixel SB form (e.g., define) a unit pixel UP. In FIG. 1, two unit pixels UP are illustrated as an example, and several million or more such unit pixels UP may be arranged two-dimensionally in the image sensor 100.

The infrared sensing elements SE2 of the infrared sensor portion 160 may be arranged such that one infrared sensing element SE2 may correspond to (e.g., vertically overlap, or overlap in a vertical direction, such as the Z direction) one unit pixel UP. However, this is merely an example, and in another example, the infrared sensing elements SE2 may be arranged such that one infrared sensing element SE2 may correspond to (e.g., vertically overlap, or overlap in a vertical direction, such as the Z direction) one subpixel SR, SG, or SB and thus the infrared sensing elements SE2 may vertically overlap the subpixels SR, SG, and SB in a one-to-one manner.

A microlens array 180 may be further arranged on the filter array 170. A plurality of lenses included in the microlens array 180 may be arranged to respectively correspond to the subpixels SR, SG and SB, and may condense incident light on the visible light sensing elements SE1 provided at positions corresponding to the subpixels SR, SG, and SB.

A bandpass filter 150 configured to transmit light only in an infrared band may be further arranged between the visible light sensor portion 130 and the infrared sensor portion 160. Owing to the bandpass filter 150, some visible light that is not absorbed by the first sensor layer 133 may be reduced or prevented from reaching the second sensor layer 167.

Among light incident on the image sensor 100, red light rays L1, green light rays L2, and blue light rays L3 of visible light are respectively incident on and detected by the visible light sensing elements SE1 corresponding to the red, green, and blue subpixels SR, SG, and SB, and infrared light rays L4 are incident on and detected by the infrared sensing element SE2.

The first signal wiring layer 135 includes: the wiring pattern P1 (e.g., first wiring pattern) having conductive elements; and an insulating layer I1. A metal material included in the conductive elements of the wiring pattern P1 blocks the propagation of light, and thus the detailed form of the wiring pattern P1 of the first signal wiring layer 135 may be determined so as not to interfere as much as possible with the path of light propagating toward the infrared sensor portion 160. For example, the first signal wiring layer 135 may include a high-density region R11 (also referred to herein as a first high-density region) in which the arrangement density of the conductive elements of the wiring pattern P1 (e.g., a first density) is relatively high and a low-density region R12 (also referred to herein as a first low-density region) in which the arrangement density of the conductive elements of the conductive pattern P1 (e.g., a second density) is relatively low (e.g., the second density is lower than the first density), and in this case, the conductive pattern P1 of the first signal wiring layer 135 may be set such that the high-density region R11 of the first signal wiring layer 135 may face (e.g., overlap in a vertical direction, such as a Z direction as shown in FIG. 1) a region defined horizontally (e.g., in the X and/or Y directions) between adjacent (e.g., horizontally-adjacent, in the X and/or Y direction) visible light sensing elements SE1 of the first sensor layer 133. Since most of the light incident on the image sensor 100 propagates toward the visible light sensing elements SE1 owing to the filter array 170, it may be possible to reduce or prevent as much as possible the propagation of the light from being blocked by the wiring pattern P1 by arranging the high-density region of the first signal wiring layer 135 between the visible light sensing elements SE1.

The second signal wiring layer 165 includes: the wiring pattern P2 (e.g., second wiring pattern) having conductive elements; and an insulating layer I2 between regions of the wiring pattern P2. Since the conductive elements of the wiring pattern P2 block the propagation of light, the detailed form of the wiring pattern P2 of the second signal wiring layer 165 may also be set like the wiring pattern P1 of the first signal wiring layer 135 such that the path of light propagating toward the second sensor layer 167 may not interfere as much as possible with the wiring pattern P2 of the second signal wiring layer 165. For example, the second signal wiring layer 165 may include a high-density region R21 in which the arrangement density of the conductive elements of the wiring pattern P2 (e.g., a third density) is relatively high and a low-density region R22 in which the arrangement density of the conductive elements of the wiring pattern P2 (e.g., a fourth density) is relatively low (e.g., the fourth density is lower than the third density), and in this case, the wiring pattern P2 of the second signal wiring layer 165 may be set such that the high-density region R21 of the second signal wiring layer 165 may face (e.g., overlap in a vertical direction, such as a Z direction as shown in FIG. 1) the high-density region R11 of the first signal wiring layer 135. Since the high-density region of the second signal wiring layer 165 faces the high-density region of the first signal wiring layer 135 which is arranged to face a region between the visible light sensing elements SE1, it may be possible to reduce or prevent as much as possible the wiring pattern P2 from blocking the propagation of light.

Figure 2:
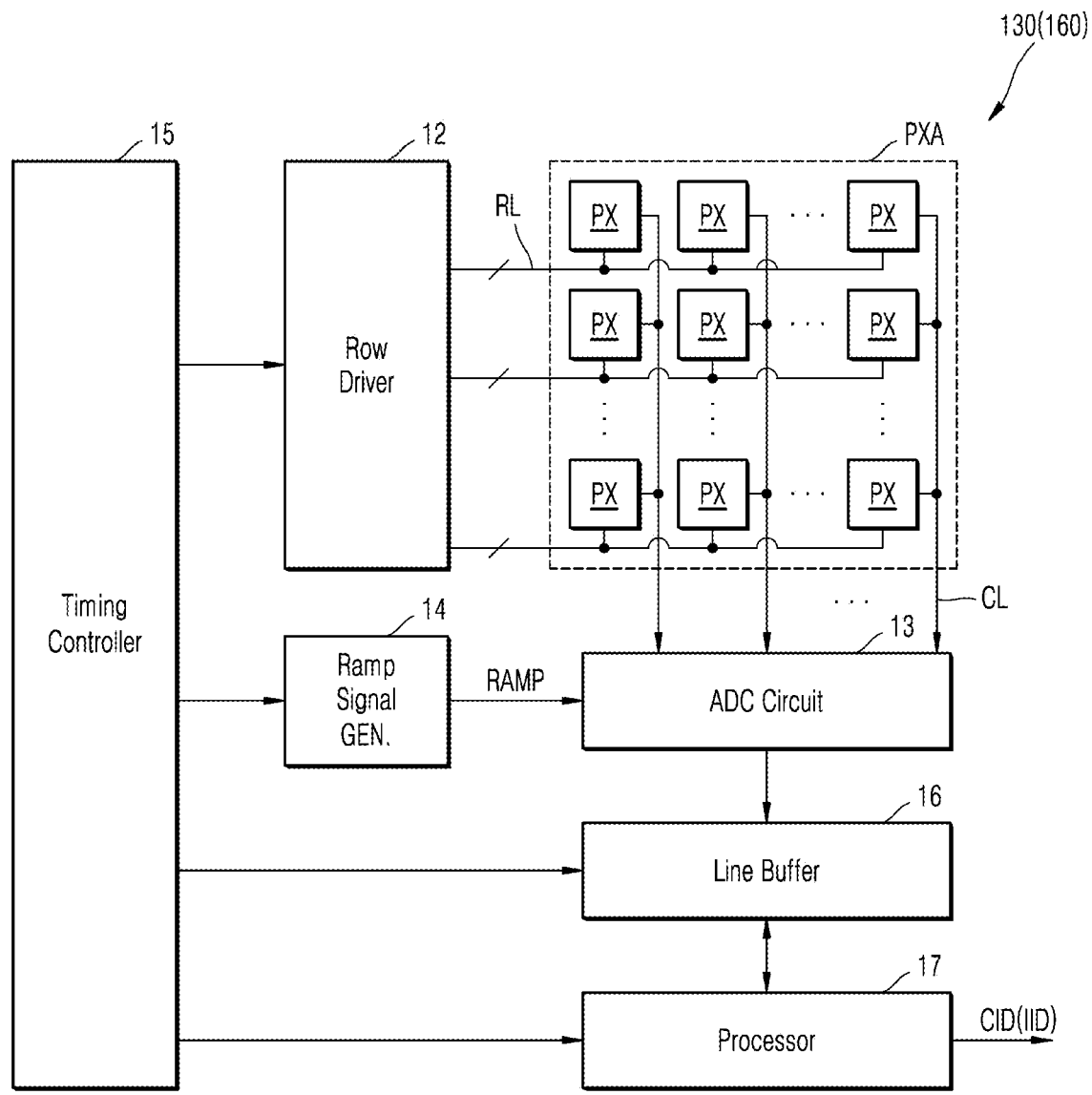
FIG. 2 is a block diagram illustrating an example circuit configuration applicable to a visible light sensor portion or an infrared sensor portion of the image sensor shown in FIG. 1.

FIG. 2 is a block diagram illustrating an example circuit configuration applicable to the visible light sensor portion 130 or the infrared sensor portion 160 of the image sensor 100 illustrated in FIG. 1.

Hereinafter, an example circuit configuration of the visible light sensor portion 130 will be described, and the example circuit configuration may also be applied to the infrared sensor portion 160.

The visible light sensor portion 130 may include a pixel array PXA, a row driver 12, an analog-to-digital converter (ADC) circuit 13, a ramp signal generator 14, a timing controller 15, a line buffer 16, and a processor 17.

The pixel array PXA includes a plurality of pixels PX arranged in a matrix form, a plurality of row lines RL connected to the pixels PX, and a plurality of column lines CL connected to the pixels PX.

Here, the pixels PX refer to the visible light sensing elements SE1 which are arranged at positions respectively corresponding to the subpixels SR, SG, and SB shown in FIG. 1. In addition, the row lines RL, the column lines CL, and a portion of wiring of each blocks may be included in the first signal wiring layer 135 shown in FIG. 1.

Each of the row lines RL may extend in a row direction and may be connected to pixels PXs arranged in the same row. In an example, the row lines RL may transmit control signals output from the row driver 12 to devices of the provided in the pixels PX, for example, to the visible light sensing elements SE1.

Each of the column lines CL may extend in a column direction and may be connected to the pixels PX arranged in the same column. Each of the column lines CL may transmit pixel signals such as a reset signal and a sensing signal, which are output from the pixels PX of the pixel array PXA on a row basis, to the ADC circuit 13.

The timing controller 15 may control timing of the row driver 12, the ADC circuit 13, the ramp signal generator 14, the line buffer 16, and the processor 17. The timing controller 15 may provide a timing signal indicating operation timing to each of the row driver 12, the ADC circuit 13, the ramp signal generator 14, the line buffer 16, and the processor 17.

The row driver 12 may generates, under the control of the timing controller 15, control signals for driving the pixel array PXA, and may provide the control signals to the pixels PX of the pixel array PXA through the row lines RL. The row driver 12 may control the pixels PXs of the pixel array PXA to sense incident light at the same time or on a row basis. In addition, the row driver 12 may select the pixels PX in units of a row or in units of at least two pixels PX and may control the selected pixels PX such that the selected pixels may output pixel signals through the column lines CL.

The ramp signal generator 14 may generate a ramp signal RAMP that increases or decreases with a particular (or, alternatively, predetermined) slope and may provide the ramp signal RAMP to the ADC circuit 13.

The ADC circuit 13 may receive a plurality of pixel signals which are read out from a plurality of pixels PX of a row selected by the row driver 12 among the pixels PX, and may convert the pixel signals into a plurality of pixel values which are digital data.

The ADC circuit 13 may generate and output image data on a row basis by converting a plurality of pixel signals received from the pixel array PXA through the column lines CL into digital data based on a ramp signal RAMP received from the ramp signal generator 14.

The ADC circuit 13 may include a plurality of ADCs corresponding to the column lines CL, and each of the ADCs may compare a pixel signal received through a corresponding column line CL with a ramp signal RAMP and may output pixel values based on results of the comparison. For example, each of the ADCs may remove a reset signal from a sensing signal by a correlated double sampling (CDS) method, and may generate pixel values indicating the amounts of light sensed by pixels PX.

The line buffer 16 may include a plurality of line memories and may store a plurality of pixel values output from the ADC circuit 13 on a row basis. In other words, the line buffer 16 may store image data, which is output from the ADC circuit 13, on a row basis. For example, the line buffer 16 may include three line memories corresponding to three rows of the pixel array PXA and may store, in the three line memories, a plurality of pixel values corresponding to the three rows among image data output from the ADC circuit 13.

The processor 17 may process a plurality of pixel values corresponding to a plurality of rows among image data stored in the line buffer 16. The processor 17 may perform image-quality compensation, binning, downsizing, or the like on image data stored in the line buffer 16 on a row basis, and may output color image data CID.

This circuit configuration may also be applied to the infrared sensor portion 160. Pixels PX of the infrared sensor portion 160 correspond to the infrared sensing element SE2 shown in FIG. 1. In this case, the processor 17 may generate infrared image data IID from an infrared sensing signal. For example, the infrared image data IID may be depth data obtained by a time of flight (TOF) method from pixel values stored in the line buffer 16 on a row basis.

The image sensor 100 may output color image data CID from a signal sensed by the visible light sensor portion 130 and may also output infrared image data (IID) from a signal sensed by the infrared sensor portion 160. Depth information about the 3D shape of an object or the temperature or moisture distribution of the object may be calculated from the infrared image data IID. 3D image data of the object may be obtained by combining the color image data CID with the infrared image data IID.

The image sensor 100, and/or any portions thereof (including, without limitation, the row driver 12, the ADC circuit 13, the ramp signal generator 14, the timing controller 15, the line buffer 16, and/or the processor 17) may include, may be included in, and/or may be implemented by one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device, for example a solid state drive (SSD), storing a program of instructions, and a processor (e.g., processor 17) configured to execute the program of instructions to implement the functionality and/or methods performed by some or all of the image sensor 100.

Figure 3:
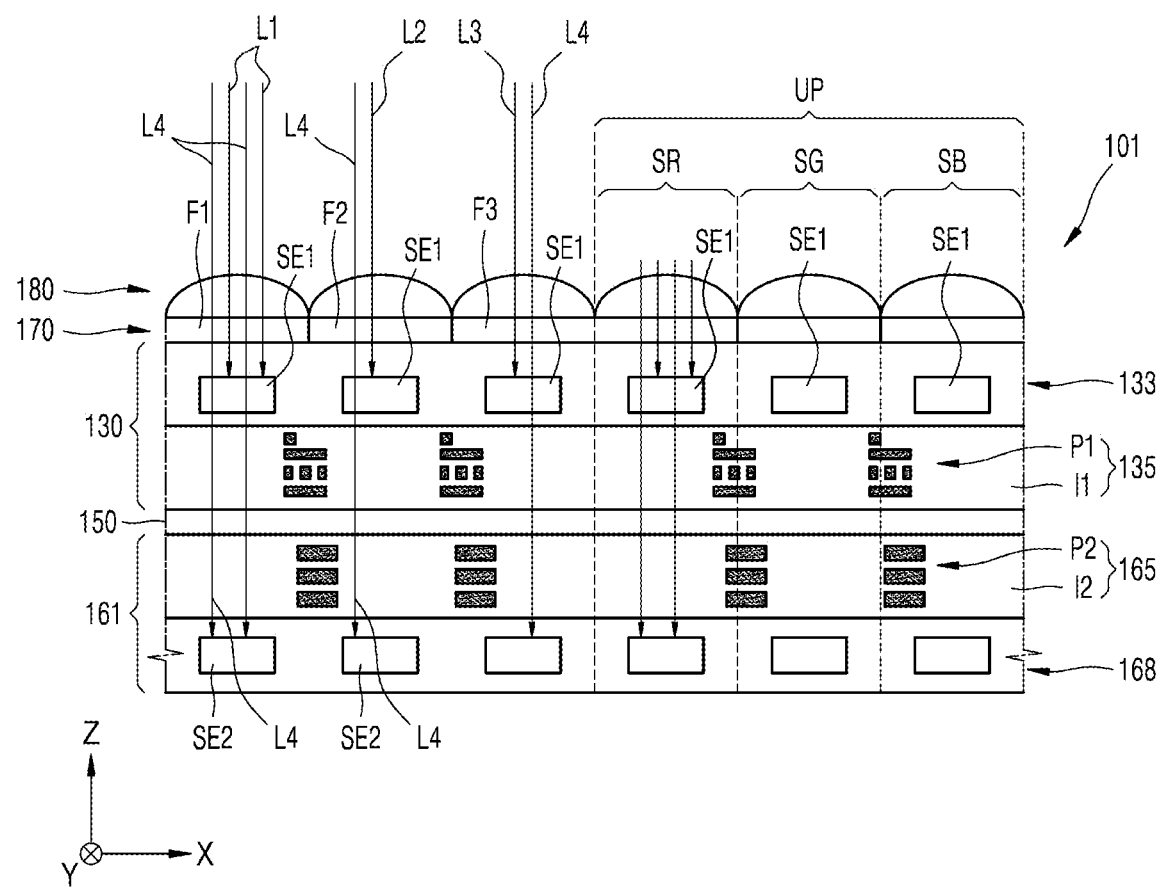
FIG. 3 is a cross-sectional view illustrating a schematic configuration of an image sensor according to some example embodiments.

FIG. 3 is a cross-sectional view schematically illustrating an image sensor 101 according to some example embodiments.

The image sensor 101 of some example embodiments is different from the image sensor 100 of FIG. 1 in the configuration of an infrared sensor portion 161. The image sensor 101 is substantially the same as the image sensor 100 of FIG. 1 except for the configuration in which a second sensor layer 168 is formed in such a manner that infrared sensing elements SE2 face visible light sensing elements SE1 on a one-to-one basis (e.g., the infrared sensing elements SE2 vertically overlap with separate, respective visible light sensing elements SE1).

In this configuration, the resolution of images processed by the infrared sensor portion 161 may be the same as the resolution of images processed by a visible light sensor portion 130.

In some example embodiments, at least some of infrared sensing elements SE2 in an infrared sensor portion according to any of the example embodiments (e.g., infrared sensor portion 160, 161, 162, 163, 164, or the like) may be configured to detect (e.g., absorb and/or photoelectrically convert) different wavelengths of infrared light (e.g., near-infrared, short-wavelength infrared, mid-wavelength infrared, long-wavelength infrared, far infrared, etc.), for example based on at least two of the infrared sensing elements SE2 including respective photoelectric conversion layers having different material compositions.

In some example embodiments, at least some of visible light sensing elements SE1 in a visible sensor portion according to any of the example embodiments (e.g., visible light sensor portion 130, 131, or the like) may be configured to detect (e.g., absorb and/or photoelectrically convert) different wavelengths of visible light (e.g., red light, green light, blue light, cyan light, magenta light, yellow light, white light, etc.), for example based on at least two of the visible sensing elements SE1 including different material compositions (e.g., different dopants).

In some example embodiments, each separate visible light sensing element SE1 may correspond to (e.g., vertically overlap, in the Z direction) multiple infrared sensing elements SE2, where said multiple infrared sensing elements SE2 vertically overlapped by the separate visible light sensing element SE1 are configured to detect different wavelengths of infrared light.

In some example embodiments, each separate infrared sensing element SE2 may correspond to (e.g., vertically overlap, in the Z direction) multiple visible light sensing elements SE1, where said multiple visible light sensing elements SE1 vertically overlapped by the separate infrared sensing element SE2 are configured to detect different wavelengths of visible light.

Figure 4A:
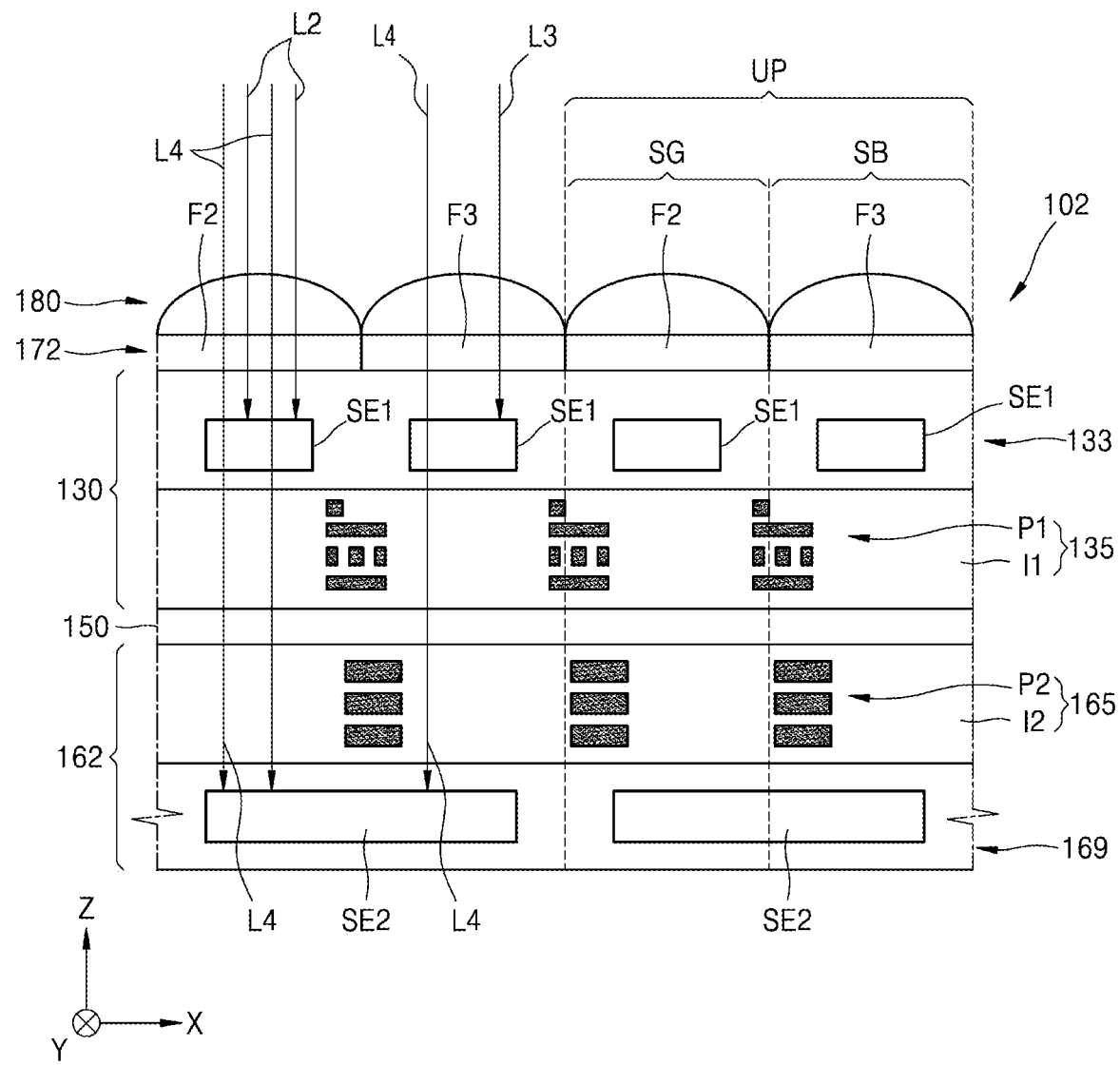
FIGS. 4A and 4B are schematic views illustrating parallel cross-sections of an image sensor according to some example embodiments.
Figure 4B:
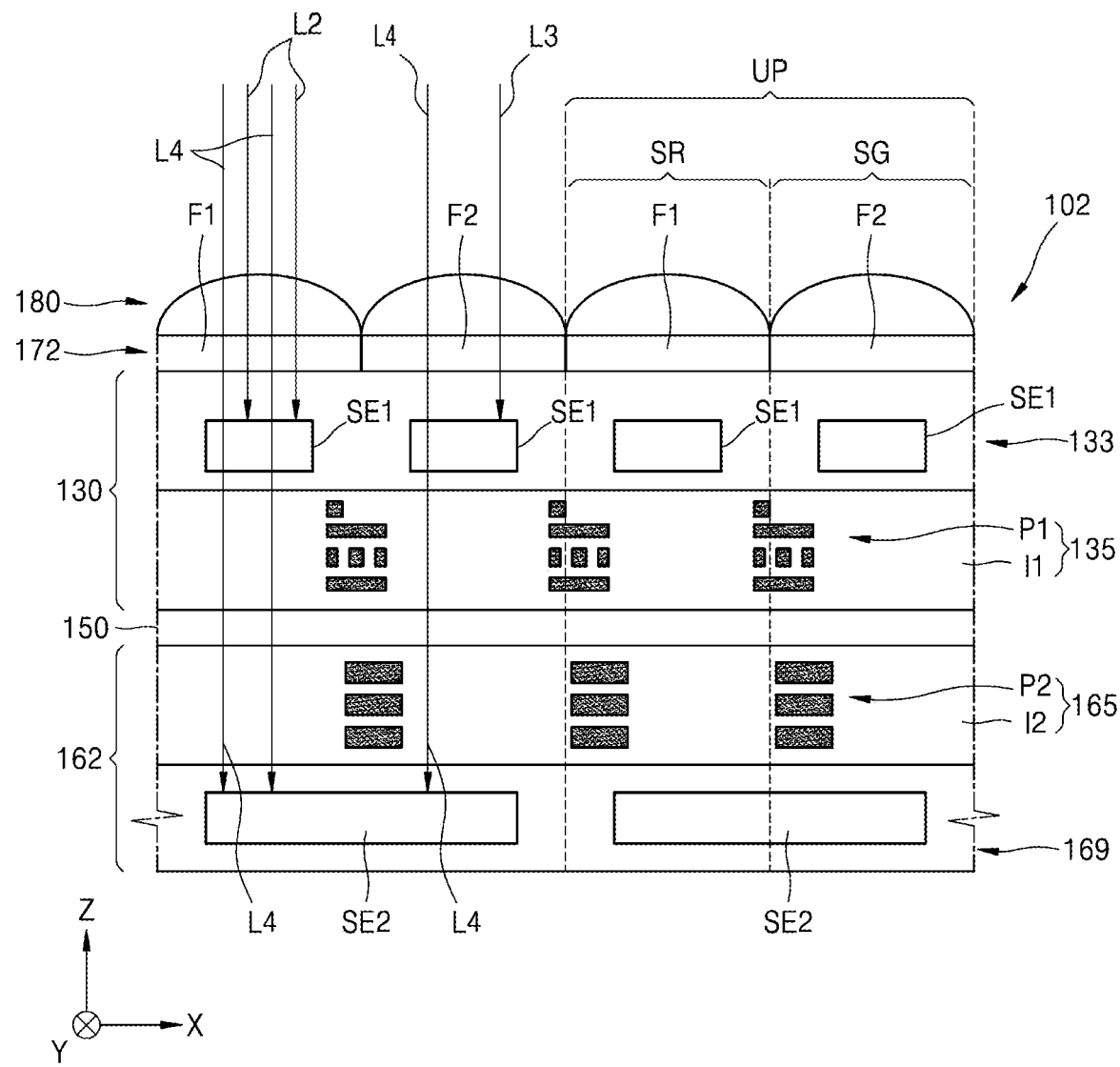
Figure 5:
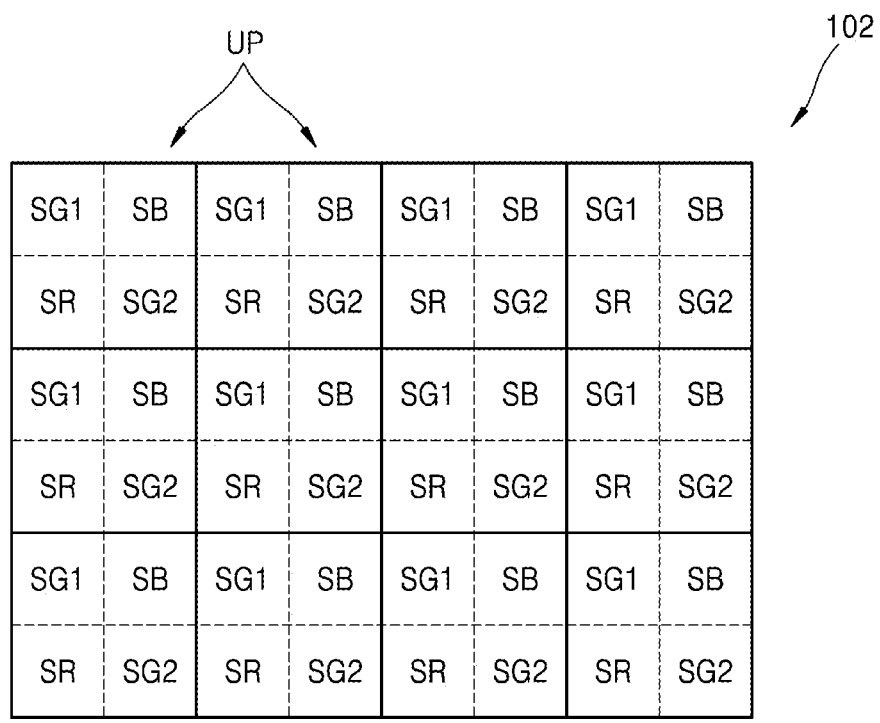
FIG. 5 is a plan view illustrating a pixel arrangement of the image sensor shown in FIGS. 4A and 4B.

FIGS. 4A and 4B are schematic views illustrating parallel cross-sections of an image sensor 102 according to some example embodiments, and FIG. 5 is a plan view illustrating a pixel arrangement of the image sensor 102 shown in FIGS. 4A and 4B.

The image sensor 102 includes an infrared sensor portion 162, including a second sensor layer 169 and a second signal wiring layer 165, and a visible light sensor portion 130, including a first sensor layer 133 and a first signal wiring layer 135, wherein a filter array 172 including first filters F1, second filters F2, and third filters F3 which correspond to a plurality of visible light sensing elements SE1 is arranged on the visible light sensor portion 130.

The image sensor 102 of some example embodiments is different from the image sensor 100 shown in FIG. 1 in that the image sensor 102 has pixels arranged in a Bayer pattern, and the difference will be described.

First, referring to FIG. 5, pixels are arranged in a Bayer pattern in which one unit pixel UP includes four quadrant regions which may respectively be a blue subpixel SB, a first green subpixel SG1, a red subpixel SR, and a second green subpixel SG2, respectively. Such unit pixels are repeatedly two-dimensionally arranged in a first direction (X direction) and a second direction (Y direction).

As shown in FIGS. 4A and 4B, the first filters F1, the second filters F2, and the third filters F3 of the filter array 172 may be arranged in such a manner that a second filter F2 faces a green subpixel SG (which may be one of the first or second green subpixels SG1 or SG2), a third filter F3 faces a blue subpixel SB, and a first filter F1 faces a red subpixel SR.

Figure 6:
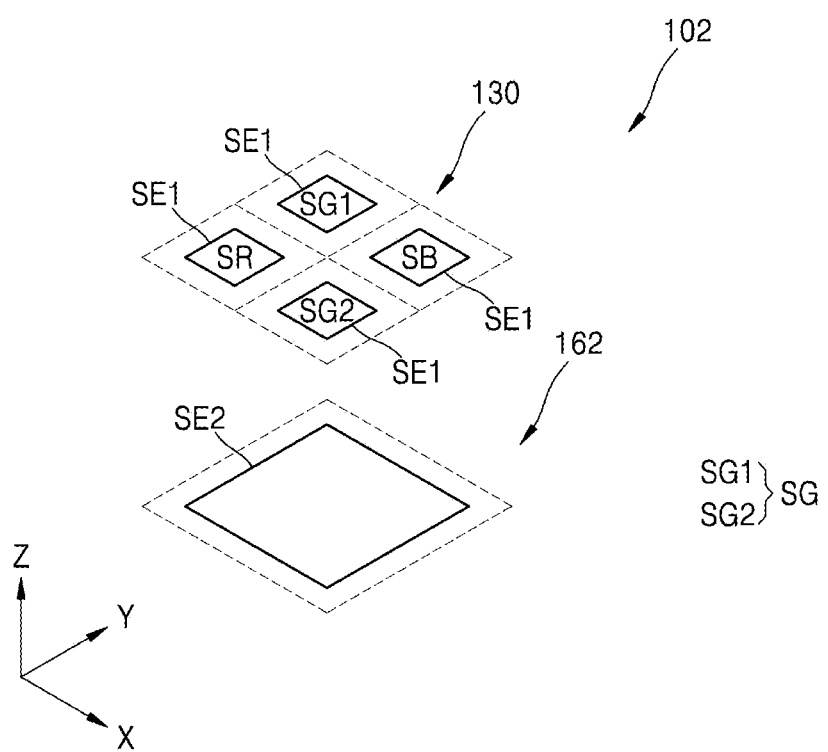
FIG. 6 is a view conceptually illustrating an arrangement relationship between visible light sensing elements and infrared sensing elements in the image sensor shown in FIGS. 4A and 4B.

FIG. 6 is a view conceptually illustrating an arrangement relationship between visible light sensing elements SE1 and infrared sensing elements SE2 in the image sensor 102 shown in FIGS. 4A and 4B.

One infrared sensing element SE2 corresponds to (e.g., vertically overlaps) one unit pixel UP formed by four subpixels, that is, a blue subpixel SB, a first green subpixel SG1, a red subpixel SR, and a second green subpixel SG2, e.g., in a one-to-one manner. However, this is an example, and in another example, a configuration in which one infrared sensing element SE2 corresponds to two subpixels may be possible.

Figure 7:
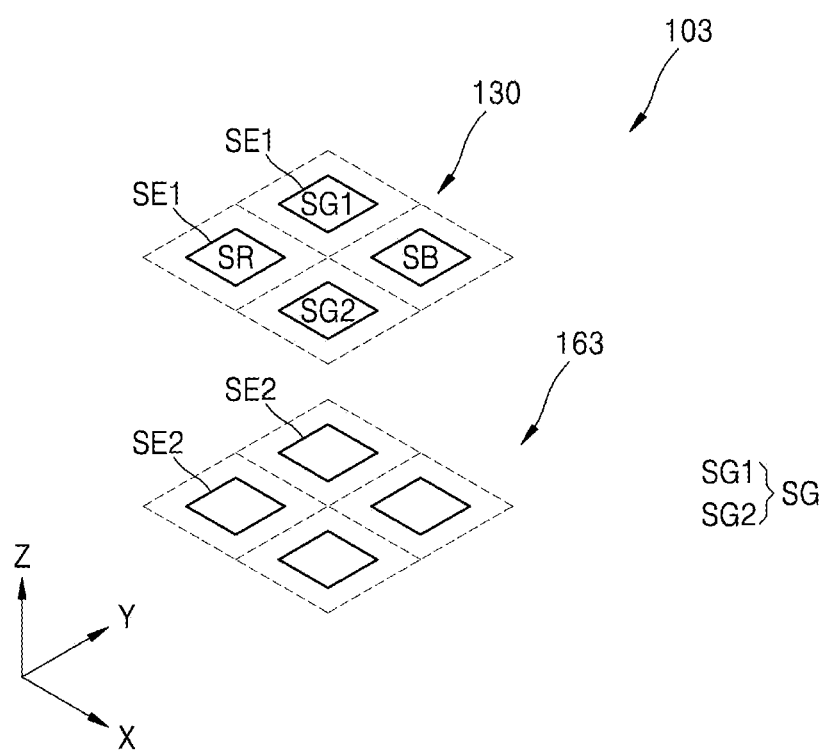
FIG. 7 is a view conceptually illustrating an arrangement relationship between visible light sensing elements and infrared sensing elements in an image sensor according to some example embodiments.

FIG. 7 is a view conceptually illustrating an arrangement relationship between visible light sensing elements SE1 and infrared sensing elements SE2 in an image sensor 103 according to some example embodiments.

The image sensor 103 of some example embodiments has a configuration in which infrared sensing elements SE2 of an infrared sensor portion 163 respectively face subpixels SR, SG, and SB, that is, visible light sensing elements SE1, in a one-to-one manner. Except this configuration, the image sensor 103 is substantially the same as the image sensor 102 described with reference to FIGS. 4A to 6.

Figure 8:
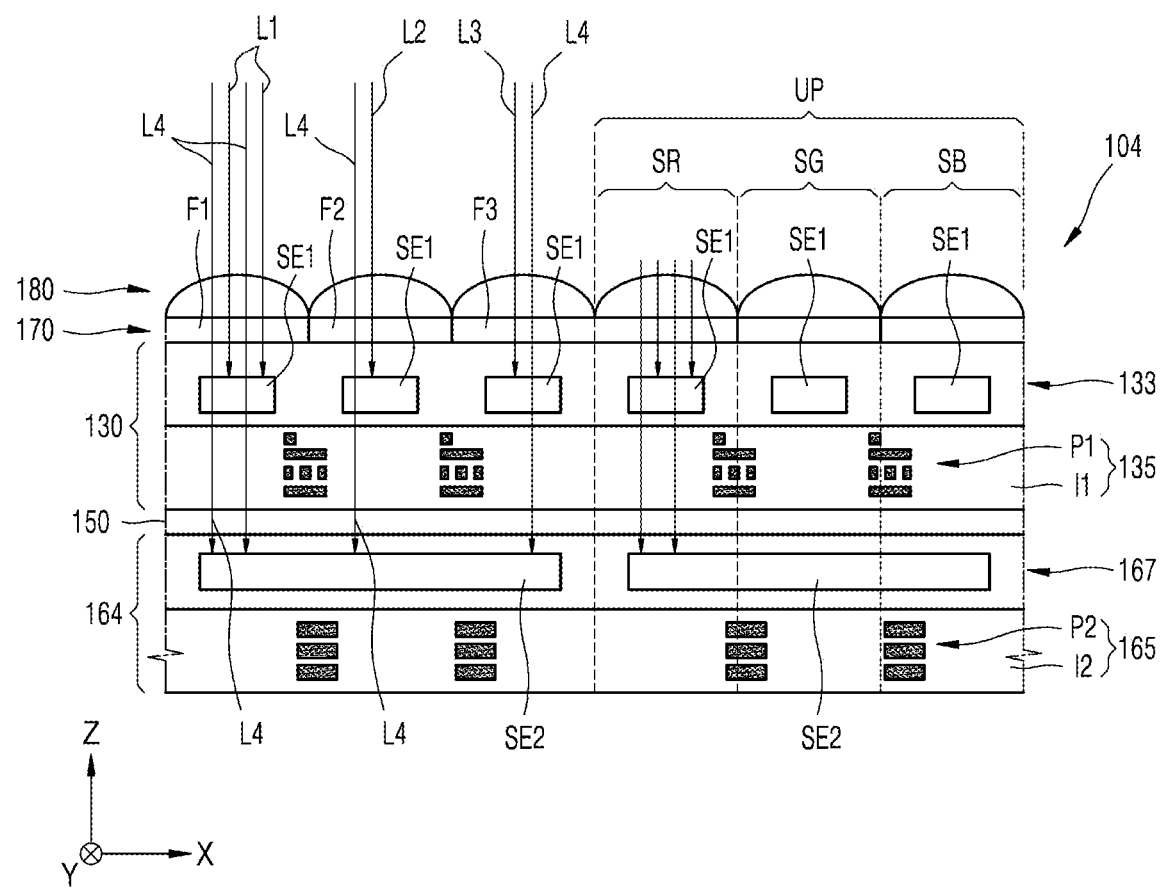
FIG. 8 is a cross-sectional view illustrating a schematic configuration of an image sensor according to some example embodiments.

FIG. 8 is a cross-sectional view schematically illustrating a configuration of an image sensor 104 according to some example embodiments.

The image sensor 104 of some example embodiments is substantially the same as the image sensor 100 described with reference to FIG. 1 except for the arrangement order of a second signal wiring layer 165 and a second sensor layer 167 of an infrared sensor portion 164.

In the image sensor 104, a visible light sensor portion 130 and the infrared sensor portion 164 have a backside illumination (BSI) structure.

In the visible light sensor portion 130, a first sensor layer 133 and a first signal wiring layer 135 are arranged in this order along an incident light path, and similarly, in the infrared sensor portion 160, the second sensor layer 167 and the second signal wiring layer 165 are arranged in this order along the incident light path.

As shown in FIG. 8, the visible light sensor portion 130 is configured such that the first sensor layer 133 is proximate to a light incident side of the image sensor 100 in relation to the first signal wiring layer 135, such that the incident light (e.g., L1 to L4) enters the first sensor layer 133 before entering the first signal wiring layer 135, and the infrared sensor portion 160 is configured such that a portion of the incident light which is not absorbed by the first sensor layer 133, for example, infrared light rays L4, may enter the second sensor layer 167 before entering the second signal wiring layer 165. For example, in the infrared sensor portion 160 shown in FIG. 8, a second sensor layer 167 and a second signal wiring layer 165 are sequentially arranged along an incident light path, such that the second sensor layer 167 is proximate to the light incident side in relation to the second signal wiring layer 165.

With regard to light efficiency that visible rays L1, L2, and L3 are incident on visible light sensing elements SE1 and infrared rays L4 are incident on infrared sensing elements SE2, this structure may be more advantageous than the structure of image sensor 100 described with reference to FIG. 1.

Figure 9:
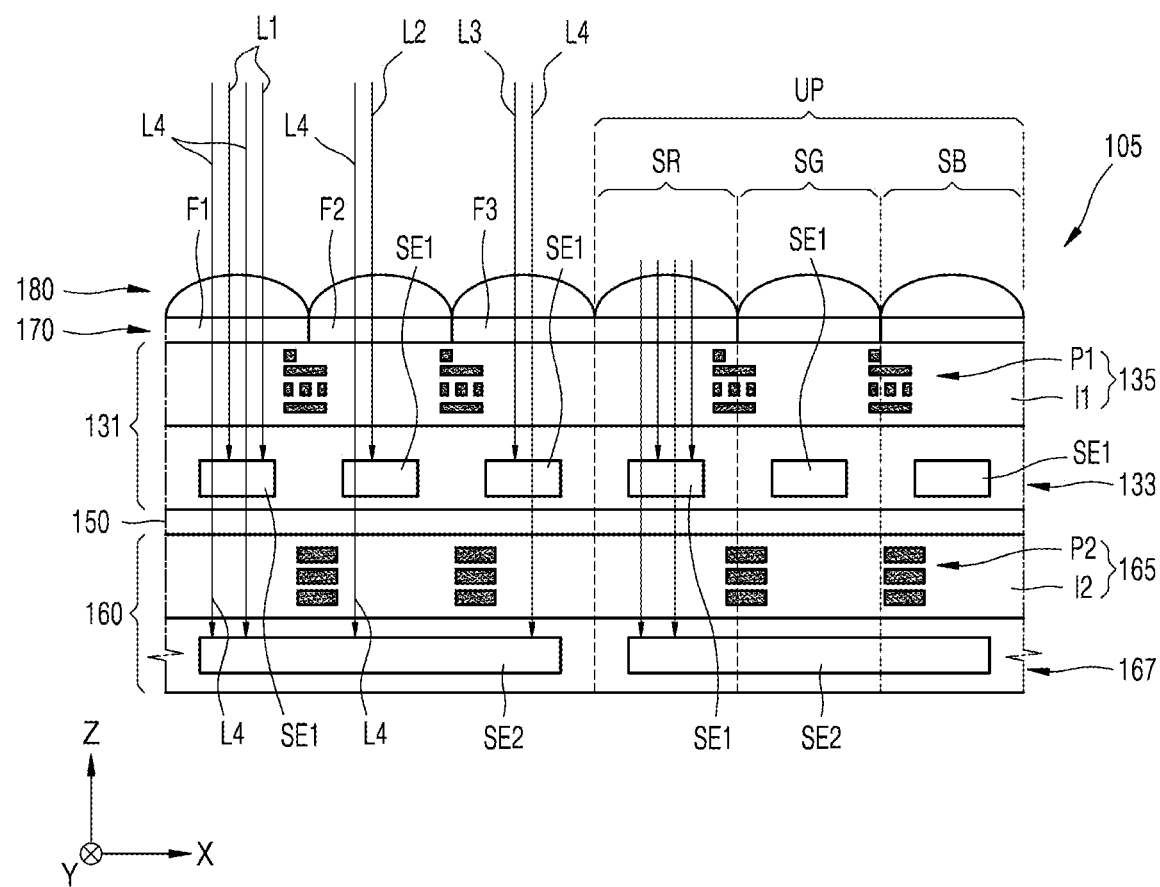
FIG. 9 is a cross-sectional view illustrating a schematic configuration of an image sensor according to some example embodiments.

FIG. 9 is a cross-sectional view schematically illustrating a configuration of an image sensor 105 according to some example embodiments.

The image sensor 105 of some example embodiments may be substantially the same as the electronic device 1000 described with reference to FIG. 1 except that a visible light sensor portion 131 and an infrared sensor portion 160 are all formed in an FSI structure.

In the visible light sensor portion 131 shown in FIG. 9, a first signal wiring layer 135 and a first sensor layer 133 are sequentially arranged along an incident light path, such that the first signal wiring layer 135 is proximate to the light incident side of the image sensor 105 in relation to the first sensor layer 133. That is, after passing through the first signal wiring layer 135, incident light is incident on (e.g., enters) the first sensor layer 133. In the infrared sensor portion 160 shown in FIG. 9, a second signal wiring layer 165 and a second sensor layer 167 are sequentially arranged along an incident light path, such that the second signal wiring layer 165 is proximate to the light incident side of the image sensor 105 in relation to the second sensor layer 167. Accordingly, a portion of the incident light which is not absorbed by the first sensor layer 133, for example, infrared rays L4, may enter (e.g., be incident on) a second sensor layer 167 after passing through a second signal wiring layer 165.

This structure may be effective in an aspect of manufacturing processes, but may result in somewhat low optical efficiency that visible rays L1, L2, and L3 are incident on visible light sensing elements SE1 and infrared rays L4 are incident on infrared sensing elements SE2.

Figure 10:
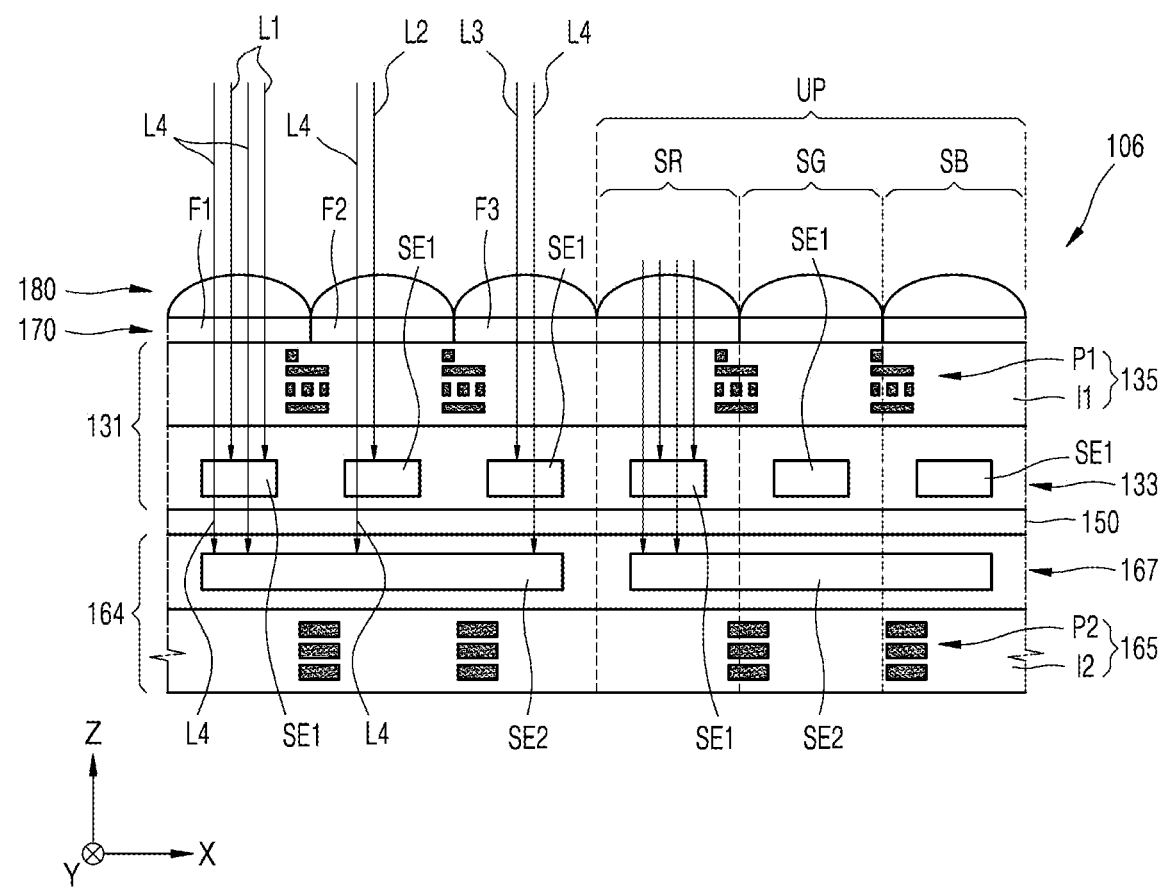
FIG. 10 is a cross-sectional view illustrating a schematic configuration of an image sensor according to some example embodiments.

FIG. 10 is a cross-sectional view schematically illustrating a configuration of an image sensor 105 according to some example embodiments.

The image sensor 105 of some example embodiments may be substantially the same as the electronic device 1000 described with reference to FIG. 1 except that a visible light sensor portion 131 has an FSI structure, and an infrared sensor portion 164 has a BSI structure. Accordingly, in the visible light sensor portion 131 shown in FIG., a first signal wiring layer 135 and a first sensor layer 133 are sequentially arranged along an incident light path, such that the first signal wiring layer 135 is proximate to the light incident side of the image sensor 105 in relation to the first sensor layer 133, and in the infrared sensor portion 160 shown in FIG. 10, a second sensor layer 167 and a second signal wiring layer 165 are sequentially arranged along an incident light path, such that the second sensor layer 167 is proximate to the light incident side of the image sensor 105 in relation to the second signal wiring layer 165.

Incident light enters the first sensor layer 133 after passing through the first signal wiring layer 135, and a portion of the incident light which is not absorbed by the first sensor layer 133, for example, infrared light rays L4, enter a second sensor layer 167 before entering a second signal wiring layer 165.

Although modifications of the image sensor 100 described with reference to FIG. 1 have been described with reference to FIGS. 8 to 10, example embodiments are not limited thereto, and the image sensors 101, 102, and 103 described with reference to FIGS. 3 to 7 may be variously modified by applying an FSI or BSI structure to a visible light sensor portion or an infrared sensor portion.

The visible light sensor portion and the infrared sensor portion may be formed in an FSI or BSI structure by considering manufacturing processes and optical efficiency.

The above-described image sensors 100, 101, 102, 103, 104, 105, and 106 may be applied to (e.g., included in) various electronic devices that use and/or perform a light sensing function. For example, the image sensors 100, 101, 102, 103, 104, 105, and 106 may be used in electronic devices such as cameras, smartphones, wearable devices, Internet of Things (IoT) devices, home appliances, tablet personal computers (PC), personal digital assistants (PDAs), portable multimedia players (PMPs), navigation systems, drones, and advanced driver assistance systems (ADASs). In addition, the image sensors 100, 101, 102, 103, 104, 105, and 106 may be used in electronic devices used as components of vehicles, furniture, manufacturing equipment, doors, measuring devices, or the like.

Figure 11:
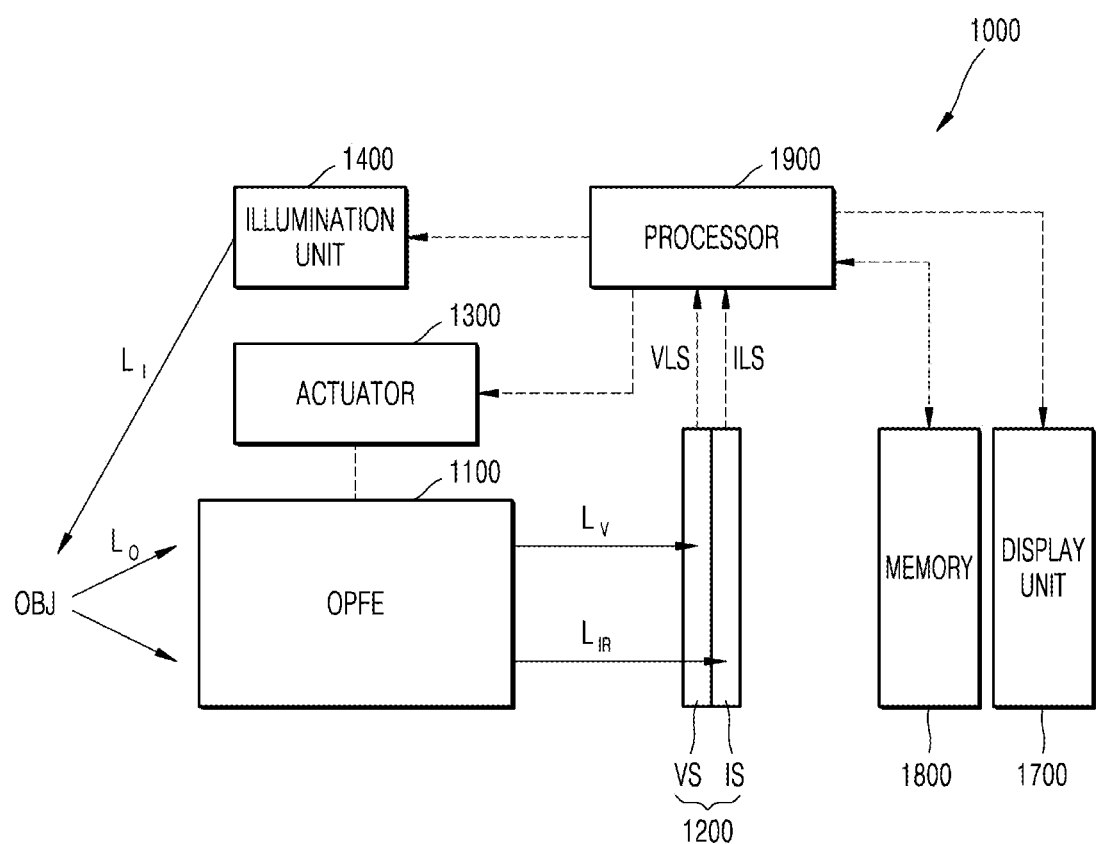
FIG. 11 is a block diagram illustrating a schematic configuration of an electronic device according to some example embodiments.

FIG. 11 is a block diagram schematically illustrating a configuration of an electronic device 1000 according to some example embodiments.

The electronic device 1000 of some example embodiments, including the example embodiments shown in FIG. 11, may include: an image sensor 1200 including a visible light sensor portion VS and an infrared sensor portion IS; and a processor 1900, also referred to herein as "processing circuitry," configured to process signals output from the visible light sensor portion VS and the infrared sensor portion IS based on the visible light sensor portion VS and the infrared sensor portion IS detecting (e.g., absorbing and/or photoelectrically converting) one or more portions of incident light, wherein the electronic device 1000 is an imaging device through which information about visible light images of an object OBJ and information about infrared images of the object OBJ are obtainable. The image sensor 1200 may be any of the image sensors according to any of the example embodiments as described herein (e.g., any one or more of image sensors 100, 101, 102, 103, 104, 105, or 106).

In addition, the electronic device may include: an optical path folding element (OPFE) 1110 configured to form (e.g., generate) an image of the object OBJ at a position of the image sensor 1200; an actuator 1300 (e.g., a servomechanism, which may include a motor configured to cause the actuator 1300 to at least partially move based on a supply of electrical power) configured to drive the OPFE 1100, and an illumination unit 1400 configured to illuminate the object OBJ with infrared rays.

In addition, the electronic device 1000 may include: a memory 1800 which stores program codes or data for operating the processor 1900; and a display unit 1700 configured to display images. The display unit 1700, also referred to herein as a display, display panel, or the like, may include, for example, a display screen, such as a light emitting diode (LED) screen, an organic light emitting diode (OLED) screen, or the like.

The memory 1800 may be a non-transitory computer readable medium and may store a program of instructions. The memory 1800 may be a nonvolatile memory, such as a flash memory, a phase-change random access memory (PRAM), a magneto-resistive RAM (MRAM), a resistive RAM (ReRAM), or a ferro-electric RAM (FRAM), or a volatile memory, such as a static RAM (SRAM), a dynamic RAM (DRAM), or a synchronous DRAM (SDRAM). The processor 1900 may execute the stored program of instructions to perform one or more functions. For example, the processor 1900 may be configured to process electrical signals generated by the image sensor 1200. The processor 1900 may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processor 1900 may be configured to generate an output (e.g., an image to be displayed by the display unit 1700) based on such processing.

The OPFE 1100 may include m groups of optical lenses (m being any positive integer). The OPFE 1100 may also include a path conversion member configured to fold the path of light coming from the object OBJ toward the image sensor 1200. The OPFE 1100 may be referred to as a vertical type or a folded type depending on whether the path conversion member is provided and arrangement with the optical lenses. The optical lenses and the path conversion member may be moved by the actuator 1300.

For example, the optical lenses of the OPFE 1100 may be moved along an optical axis to adjust the optical zoom ratio of the OPFE 1100. When a basic optical zoom ratio is Z, the optical zoom ratio may be adjusted to 3Z, 5Z or greater by moving at least some of the optical lenses of the OPFE 1100 to adjust the distance between adjacent optical lenses.

The actuator 1300 may drive at least some components of the OPFE 1100. The actuator 1300 may adjust the positions of the optical lenses to place the image sensor 1200 at the focal length of the optical lenses and obtain a desired zoom ratio.

The illumination unit 1400 may include a light source such as a laser diode (LD), a light-emitting diode (LED), or a super luminescent diode (SLD) configured to emit infrared light $L_I$. The light source may be configured to emit infrared light, for example, light in a wavelength band of about 750 nm to about 2500 nm.

The illumination unit 1400 may further include: a component for illuminating the object OBJ with light modulated at a particular (or, alternatively, predetermined) frequency, and an optical member configured to adjust the path or range of illumination light.

The image sensor 1200 includes the visible light sensor portion VS configured to sense (e.g., detect) visible light $L_V$ and the infrared sensor portion IS configured to sense (e.g., detect) infrared light $L_{IR}$. Any one, a combination, or a modification of the image sensors 100,101,102,103,104,105, and 106 of the above-described example embodiments may be used as the image sensor 1200.

Light coming from the object OBJ may form an image on the image sensor 1200 owing to the OPFE 1110. Light $L_O$ coming from the object OBJ includes reflected visible light $L_V$ (e.g., visible incident light) and reflected infrared light $L_{IR}$ (e.g., infrared incident light), where the reflected infrared light $L_{IR}$ may include at least a portion of the infrared light $L_I$ emitted by the illumination unit 1400 and reflected off of the object OBJ. The light $L_O$ coming from the object OBJ is incident on the image sensor 1200 along the same light path. The image sensor 1200 has a structure in which the visible light sensor portion VS and the infrared sensor portion IS are stacked, and may thus sense visible light and infrared light substantially at the same time. The visible light sensor portion VS may detect (e.g., absorb and/or photoelectrically convert) at least a portion of the visible light $L_V$ and output (e.g., generate and/or transmit) a visible light signal VLS based on said detecting. The infrared sensor portion IS may detect (e.g., absorb and/or photoelectrically convert) at least a portion of the infrared light $L_{IR}$ and output (e.g., generate and/or transmit) an infrared light signal ILS based on said detecting.

The structure is simple and enables simple image processing because methods of the related art, such as a method of spatially dividing an optical path, a method of dividing a resolution space of an image sensor, or a method of sensing visible light and infrared light in a time division manner, are not used to obtain visible light information and infrared information about an object.

The processor 1900 may process signals output from the visible light sensor portion VS (e.g., the visible light signal VLS) and the signal from the infrared sensor portion IS (e.g., the infrared light signal ILS) and may control overall operations of the electronic device 1000 such as the operations of the illumination unit 1400 and the actuator 1300.

The processor 1900 may calculate depth information about (e.g., associated with) the object OBJ from infrared image information about the object OBJ (e.g., based on processing the infrared light signal ILS), and may provide 3D images of the object OBJ by combining the depth information with visible light image information about the object OBJ (e.g., information determined based on receiving and/or processing one or more visible light signals VLS).

In addition, the processor 1900 may calculate temperature or moisture information about the object OBJ from infrared image information about the object OBJ (e.g., based on processing the infrared light signal ILS), and may provide a temperature distribution image or a moisture distribution image by combining the temperature or moisture information with 2D images of the object OBJ (which may be generated based on processing one or more visible light signal(s) VLS).

The processor 1900 may use a time of flight (TOF) method to obtain depth information from light sensed by the infrared sensor portion IS. The TOF method was introduced to obtain more accurate distance information by measuring the time of flight of a light beam emitted to an object, reflected from the object, and received by a light receiving unit. According to the TOF method, light having a particular wavelength (for example, near infrared light having a wavelength of about 850 nm) is emitted to the object OBJ, light having the same wavelength and reflected from the object OBJ is received by a light receiving unit, and then a processing process is performed to extract distance information. Various examples of the TOF method having such a series of procedures are known in the art. For example, according to a direct time measuring method, pulsed light is emitted to an object, and the period of time until the pulsed light is reflected back is measured using a timer, and the distance to the object is calculated using the time period. According to a correlation method, pulsed light is emitted to an object, and the distance to the object is measured based on the brightness of light reflected back from the object. According to a phase delay measurement method, continuous wave light such as sine wave light is emitted to an object, and the phase difference between the continuous wave light and light reflected back from the object is sensed to convert the phase difference into the distance to the object.

For example, the processor 1900 may calculate depth image information about the object OBJ according to any one of the above-described examples of the TOF method. When the processor 1900 performs depth image processing, the processor 1900 may apply binning to the infrared sensor portion IS and may adjust the accuracy of the depth image processing as needed.

The processor 1900 may form a 3D image by depth image information obtained as described above with color image information.

The electronic device 1000, and/or any portions thereof (including, without limitation, the OPFE 1100, the actuator 1300, the illumination unit 1400, the memory 1800, the processor 1900, the display unit 1700, and/or the image sensor 1200) may include, may be included in, and/or may be implemented by one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., memory 1800), for example a solid state drive (SSD), storing a program of instructions, and a processor (e.g., processor 1900) configured to execute the program of instructions to implement the functionality and/or methods performed by some or all of the electronic device 1000.

Figure 12:
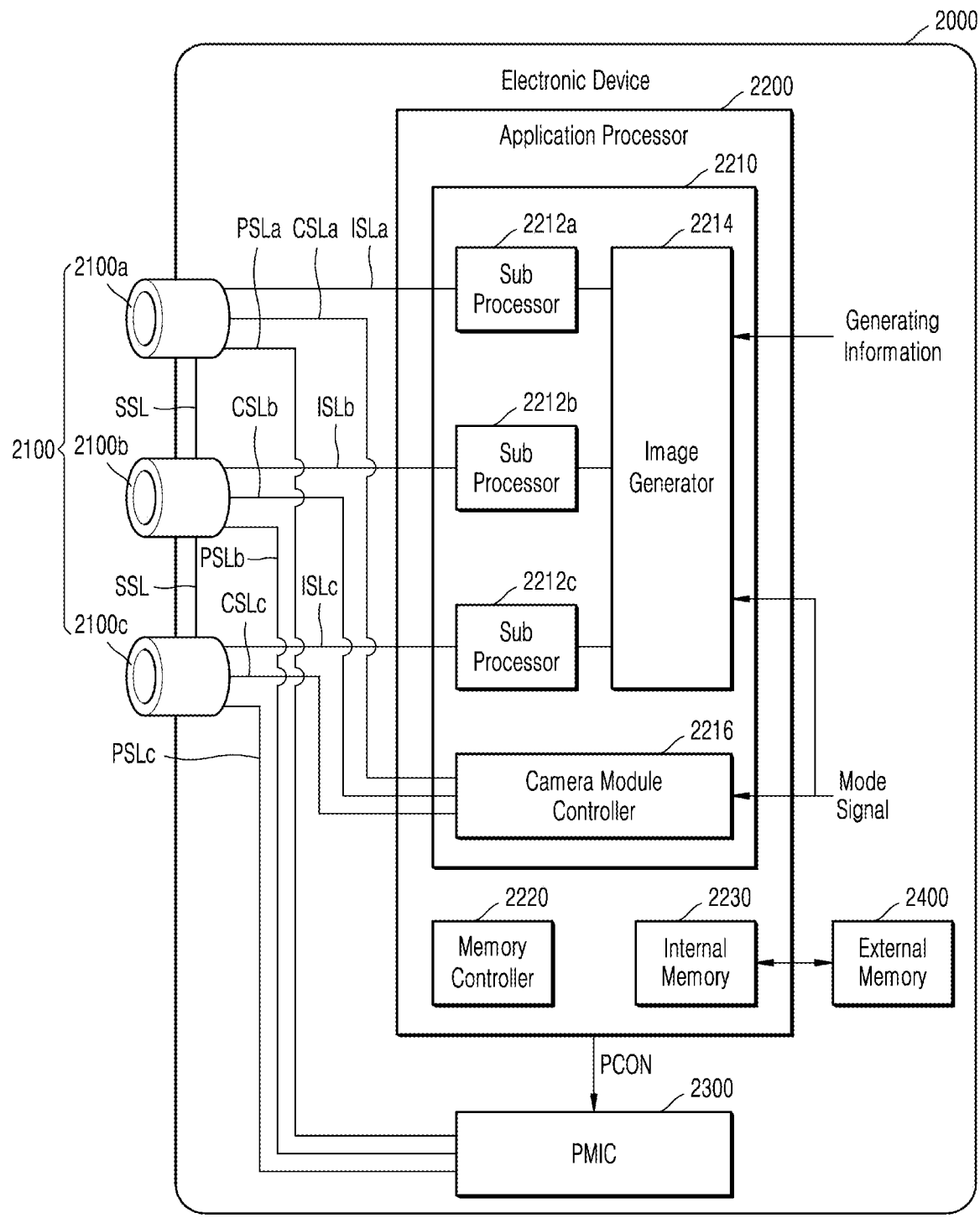
FIG. 12 is a block diagram illustrating a schematic configuration of an electronic device according to some example embodiments.
Figure 13:
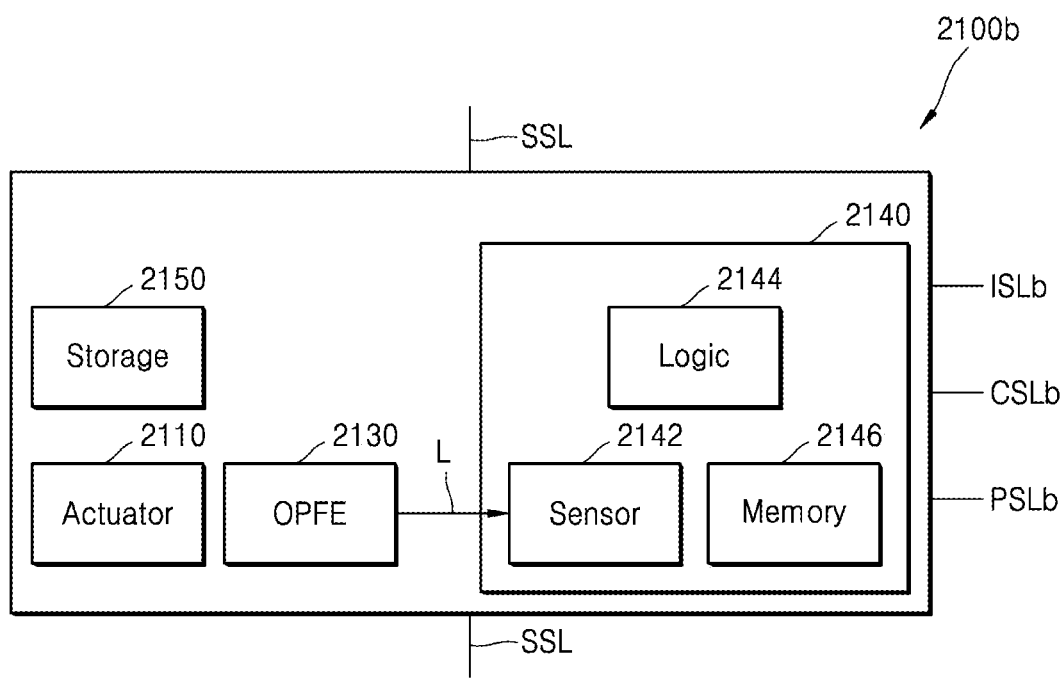
FIG. 13 is a block diagram illustrating a schematic configuration of a camera module provided in the electronic device shown in FIG. 12.

FIG. 12 is a block diagram illustrating a schematic configuration of an electronic device 2000 according to some example embodiments, and FIG. 13 is a block diagram illustrating a schematic configuration of a camera module 2100b provided in the electronic device 2000 shown in FIG. 12.

The electronic device 2000 of some example embodiments has application using multiple camera modules, also referred to herein as simply "cameras."

Referring to FIG. 12, the electronic device 2000 may include a camera module group 2100, an application processor 2200, a power management integrated circuit (PMIC) 2300, and an external memory 2400.

The camera module group 2100 may include a plurality of camera modules 2100a, 2100b, and 2100c, also referred to herein as cameras. Although three camera modules 2100a, 2100b, and 2100c are arranged in the example embodiments shown in FIG. 12, example embodiments are not limited thereto. In some example embodiments, the camera module group 2100 may be modified to have only two camera modules. In some example embodiments, the camera module group 2100 may be modified to have n camera modules (where n is a natural number equal to or greater than 4).

With reference to FIG. 13, the camera module 2100b provided in the electronic device 2000 shown in FIG. 12 will be described. The configuration of the camera module 2100b illustrated in FIG. 13 may be applied to the other camera modules 2100a and 2100c.

Referring to FIG. 13, the camera module 2100b includes an image sensing device 2140, an OPFE 2130, an actuator 2110, and a storage 2150. The image sensing device 2140 includes an image sensor 2142, a control logic 2144, and a memory 2146.

The OPFE 2130 may include one or more optical lenses and a path conversion member configured to fold a light path toward the image sensor 2142. The camera module 2100b may be of a vertical type or a folded type depending on the arrangement of the optical lenses and whether the camera module 2100b includes a path conversion member.

The actuator 2110, which may be a servomechanism, drives the OPFE 2130. The actuator 2110 may move at least some of the optical lenses and the path conversion member of the OPFE 2130. The actuator 2110 may adjust the positions of the optical lenses to place the image sensor 2142 at the focal length of the optical lenses and obtain a desired zoom ratio.

The optical lenses may be moved along an optical axis to adjust the optical zoom ratio of the OPFE 2130. When a basic optical zoom ratio is Z, the optical zoom ratio may be adjusted to 3Z, 5Z or greater by moving at least some of the optical lenses of the OPFE 2130 to adjust the distance between adjacent lenses.

Any one of the image sensors 100, 101, 102, 103, 104, 105, or 106 having a visible light sensor and an infrared sensor according to the any of the example embodiments may be used as the image sensor 2142, and thus the image sensor 2142 may separately sense infrared light and visible light from light provided through the OPFE 2130.

The control logic 2144 may control the overall operation of the camera module 2100b. For example, the control logic 2144 may control the operation of the camera module 2100b according to a control signal provided through a control signal line CSLb.

The memory 2146 may store data such as calibration data that is used for the operation of the camera module 2100b. The calibration data may include information necessary for the camera module 2100b to generate image data using light L provided from the outside. For example, the calibration data may include information such as information related to the operation of the actuator 2110 for driving the OPFE 2130, information about the focal length of the optical lenses, and information about the optical axis. When the camera module 2100b is implemented as a multi-state camera module having a focal length variable depending on the positions of the optical lenses, the calibration data may include focal length values with respect to the positions (or states) of the optical lenses and information about autofocusing.

The storage 2150 may store image data sensed by the image sensor 2142. The storage 2150 may be provided on an outer side of the image sensing device 2140 in a form in which the storage 2150 and a sensor chip of the image sensing device 2140 are stacked. In some example embodiments, the storage 2150 may be implemented as an electrically erasable programmable read-only memory (EEPROM), but example embodiments are not limited thereto.

The camera module 2100b, and/or any portions thereof (including, without limitation, the image sensing device 2140, image sensor 2142, control logic 2144, memory 2146, actuator 2110, OPFE 2130, and/or storage 2150) may include, may be included in, and/or may be implemented by one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., memory 2146), for example a solid state drive (SSD), storing a program of instructions, and a processor (e.g., control logic 2144) configured to execute the program of instructions to implement the functionality and/or methods performed by some or all of the camera module 2100b.

Referring back to FIG. 12, the application processor 2200 may include an image processing device 2210, a memory controller 2220, and an internal memory 2230. The application processor 2200 may be provided separately from the camera modules 2100a, 2100b, and 2100c. For example, the application processor 2200 and the camera modules 2100a, 2100b, and 2100c may be implemented as separate semiconductor chips.

The image processing device 2210 may include a plurality of sub processors 2212a, 2212b, and 2212c, an image generator 2214, and a camera module controller 2216.

The number (e.g., quantity) of sub processors 2212a, 2212b, and 2212c of the image processing device 2210 may correspond to the number of camera modules 2100a, 2100b, and 2100c.

Image data generated by the camera modules 2100a, 2100b, and 2100c may be provided to the sub processors 2212a, 2212b, 2212c through separate image signal lines ISLa, ISLb, ISLc. For example, image data generated by the camera module 2100a may be provided to the sub processor 2212a through the image signal line ISLa, image data generated by the camera module 2100b may be provided to the sub processor 2212b through the image signal line ISLb, and image data generated by the camera module 2100c may be provided to the sub processor 2212c through the image signal line ISLc. Such image data transmission may be performed using, for example, a camera serial interface (CSI) which is based on a mobile industry processor Interface (MIPI), but embodiments are not limited thereto.

Alternatively, in some example embodiments, one sub processor may be arranged to correspond to a plurality of camera modules. For example, the sub processor 2212a and the sub processor 2212c may be implemented as one integrated sub processor instead of being separately provided as described in FIG. 12, and image data generated by the camera module 2100a and the camera module 2100c may be selected by a selection device (for example, a multiplexer) or the like and may then be provided to the integrated sub processor.

Image data provided to the sub processors 2212a, 2212b, 2212c may be transmitted to the image generator 2214. According to image generating information or a mode signal, the image generator 2214 may generate an output image from the image data provided from the sub processors 2212a, 2212b, and 2212c.

For example, the image generator 2214 may generate an output image according to image generating information or a mode signal by merging at least some pieces of image data generated by the camera modules 2100a, 2100b, and 2100c having different angles of view. Alternatively, the image generator 2214 may generate an output image according to image generating information or a mode signal by selecting one of pieces of image data generated by the camera modules 2100a, 2100b, and 2100c having different angles of view.

In some example embodiments, the image generating information may include a zoom signal or a zoom factor. Furthermore, in some example embodiments, the mode signal may be, for example, a signal based on a mode selected by a user.

When the image generating information is a zoom signal (zoom factor) and the camera modules 2100a, 2100b, and 2100c have different angles of view, the image generator 2214 may perform different operations according to the type of the zoom signal. For example, when the zoom signal is a first signal, the image generator 2214 may merge image data output from the camera module 2100a with image data output from the camera module 2100c and may then generate an output image by using the merged image data and image data output from the camera module 2100b not used for the merging. When the zoom signal is a second signal different from the first signal, the image generator 2214 may not perform such image data merging and may select one of pieces of image data output from the camera modules 2100a, 2100b, 2100c as an output image. However, example embodiments are not limited thereto, and the method of processing image data may be modified and performed as needed.

In some example embodiments, the image generator 2214 may receive a plurality of pieces of image data having different exposure times from at least one of the sub processors 2212a, 2212b, or 2212c, and may perform high dynamic range (HDR) processing on the received pieces of image data to generate merged image data having an increased dynamic range.

The camera module controller 2216 may provide a control signal to each of the camera modules 2100a, 2100b, and 2100c. Control signals generated by the camera module controller 2216 may be provided to the camera modules 2100a, 2100b, and 2100c through control signal lines CSLa, CSLb, and CSLc which are separate from each other.

According to image generating information or a mode signal including a zoom signal, one of the camera modules 2100a, 2100b, or 2100c may be designated as a master camera module (for example, the camera module 2100b), and the remaining camera modules (for example, the camera modules 2100a and 2100c) may be designated as slave camera modules. Such information may be included in a control signal and may be provided to the camera modules 2100a, 2100b, and 2100c through the control signal lines CSLa, CSLb, and CSLc which are separate from each other.

Depending on a zoom factor or an operation mode signal, the roles (a master or slaves) of the camera modules 2100a, 2100b, and 2100c may be changed. For example, when the camera module 2100a has a wider angle of view and a zoom magnification with a lower zoom factor than the camera module 2100b, the camera module 2100b may act as a master, and the camera module 2100a may act as a slave. Conversely, when the camera module 2100a has a zoom magnification with a higher zoom factor than the camera module 2100b, the camera module 2100a may act as a master, and the camera module 2100b may act as a slave.

In some example embodiments, a control signal provided to the camera modules 2100a, 2100b, and 2100c from the camera module controller 2216 may include a sync enable signal. For example, when the camera module 2100b is a master camera module and the camera modules 2100a and 2100c are slave camera modules, the camera module controller 2216 may transmit a sync enable signal to the camera module 2100b. The camera module 2100b received the sync enable signal may generate a sync signal based on the provided sync enable signal, and may provide the sync signal to the camera modules 2100a and 2100c through sync signal lines SSL. The camera module 2100b and the camera modules 2100a and 2100c may be synchronized with the sync signal and may transmit image data to the application processor 2200.

In some example embodiments, a control signal provided to the camera modules 2100a, 2100b, and 2100c from the camera module controller 2216 may include mode information according to a mode signal. Based on the mode information, the camera modules 2100a, 2100b, and 2100c may operate in a first operation mode and a second operation mode related to the speed of sensing.

In the first operation mode, the camera modules 2100a, 2100b, and 2100c may generate image signals at a first rate (for example, at a first frame rate), encode the image signals at a second rate greater than the first rate (for example, at a second frame rate greater than the first frame rate), and transmit the encoded image signals to the application processor 2200. In this case, the second rate may be equal to or less than 30 times the first rate.

The application processor 2200 may store the received image signals, that is, the encoded image signals, in the internal memory 2230 provided in the application processor 2200 or in the external memory 2400 provided outside the application processor 2200, and thereafter, the application processor 2200 may read the encoded image signals from the internal memory 2230 or the external memory 2400, decode the encoded image signals, and may display image data generated based on the decoded image signals. For example, the sub processors 2212a, 2212b, and 2212c of the image processing device 2210, which correspond to the encoded image signals, may perform decode the encoded image signals and may perform image processing on the decoded image signals.

In the second operation mode, the camera modules 2100a, 2100b, and 2100c may generate image signals at a third rate less than the first rate (for example, at a third frame rate less than the first frame rate) and may transmit the image signals to the application processor 2200. The image signals transmitted to the application processor 2200 may be unencoded image signals. The application processor 2200 may perform image processing on the received image signals or may store the image signals in the internal memory 2230 or the external memory 2400.

The PMIC 2300 may supply power, for example, a power supply voltage, to each of the camera modules 2100a,

2100b, and 2100c. For example, under the control of the application processor 2200, the PMIC 2300 may supply first power to the camera module 2100a through a power signal line PSLa, second power to the camera module 2100b through a power signal line PSLb, and third power to the camera module 2100c through a power signal line PSLc.

The PMIC 2300 may generate power corresponding to each of the camera modules 2100a, 2100b, and 2100c in response to a power control signal PCON from the application processor 2200, and may also adjust the level of power. The power control signal PCON may include a power adjustment signal for each operation mode of the camera modules 2100a, 2100b, and 2100c. For example, the operation mode may include a low power mode, and in this case, the power control signal PCON may include information about a camera module operating in the low power mode and a power level for the camera module. The levels of power provided to the camera modules 2100a, 2100b, and 2100c may be equal to each other or may be different from each other. In addition, the levels of power may be dynamically varied.

In the above description, the image sensor 2142 provided in at least one of the camera modules 2100a, 2100b, or 2100c may include a visible light sensor portion and an infrared sensor portion as described in the previous embodiments. Image sensors 2142 provided in some of the camera modules 2100a, 2100b, and 2100c may be a general image sensor including only a visible light sensor portion.

The electronic device 2000 is illustrated as having a configuration for using multiple camera modules, but the electronic device 2000 may have another configuration.

The electronic device 2000, and/or any portions thereof (including, without limitation, the application processor 2200, the image processing device 2210, the memory controller 2220, the internal memory 2230, any of the sub processors 2212a to 2212c, image generator 2214, camera module controller 2216, the PMIC 2300, the external memory 240, and/or any of the camera modules 2100a-2100c of the camera module group 2100) may include, may be included in, and/or may be implemented by one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., internal memory 2230 and/or external memory 2400), for example a solid state drive (SSD), storing a program of instructions, and a processor (e.g., image processing device 2210 or any portion thereof, memory controller 2220, etc.) configured to execute the program of instructions to implement the functionality and/or methods performed by some or all of the electronic device 2000.

Any of the memories described herein, including, without limitation, internal memory 2230, external memory 2400, memory 2146, and/or storage 2150 may be a non-transitory computer readable medium and may store a program of instructions. Any of the memories described herein may be a nonvolatile memory, such as a flash memory, a phase-change random access memory (PRAM), a magneto-resistive RAM (MRAM), a resistive RAM (ReRAM), or a ferro-electric RAM (FRAM), or a volatile memory, such as a static RAM (SRAM), a dynamic RAM (DRAM), or a synchronous DRAM (SDRAM).

FIGS. 14A, 14B, 14C, 14D, 14E, 14F, 14G, and 14H are views illustrating a method of manufacturing an image sensor according to some example embodiments.

Figure 14A:
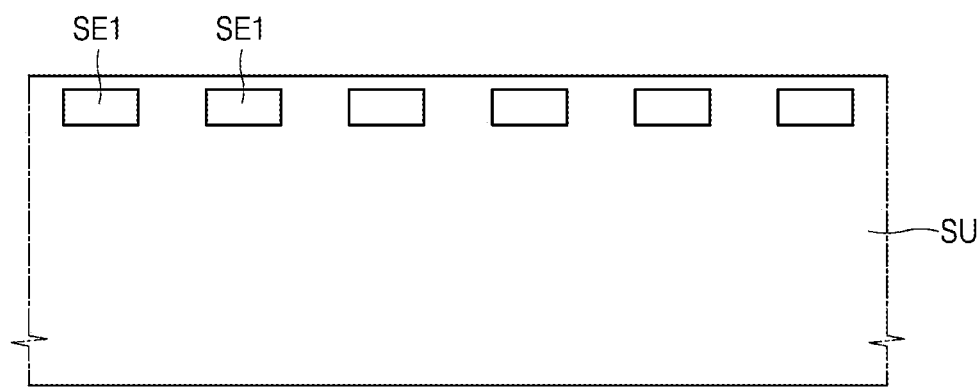
FIGS. 14A, 14B, 14C, 14D, 14E, 14F, 14G, and 14H are views illustrating a method of manufacturing an image sensor according to some example embodiments.
Figure 14A:
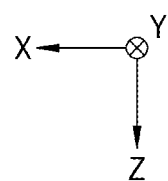

Referring to FIG. 14A, a plurality of visible light sensing elements SE1 are first formed on and/or within a semiconductor substrate SU. Such forming may include placing pre-fabricated visible light sensing elements SE1 on the semiconductor substrate SU and further forming the semiconductor substrate SU around and/or over the visible light sensing elements SE1 by a deposition process, which may include chemical vapor deposition (CVD) process, an atomic layer deposition (ALD) process, or a physical vapor deposition (PVD) process such as a sputtering process.

The semiconductor substrate SU may include silicon or a compound semiconductor.

The visible light sensing elements SE1 may include CMOS transistor devices, or various types of photodiodes or phototransistors. In some example embodiments, the visible light sensing elements SE1 may include CMOS transistor devices.

A process of implanting a dopant in particular (or, alternatively, predetermined) regions of the semiconductor substrate SU while adjusting the concentration and type of the dopant according to positions may be performed to form the visible light sensing elements SE1. The visible light sensing elements SE1 are conceptually illustrated in FIG. 14A, and the detailed structure of the visible light sensing elements SE1 is not illustrated in FIG. 14A. The number of visible light sensing elements SE1 is determined by considering the resolution of an image sensor to be manufactured.

Figure 14B:
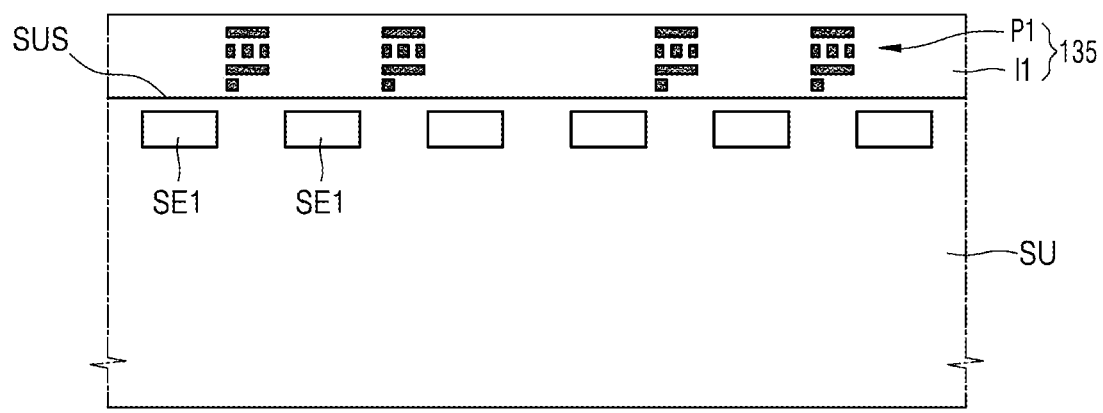
Figure 14B:
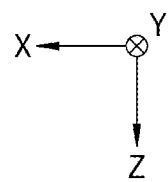

Next, as shown in FIG. 14B, a first signal wiring layer 135 is formed on a surface SUS the semiconductor substrate SU on which the visible light sensing elements SE1 are formed. The first signal wiring layer 135 includes a wiring pattern P1 and an insulating layer I1. The wiring pattern PI is for (e.g., configured to perform) reading and/or processing signals output from the visible light sensing elements SE1, and includes a plurality of conductive elements. A process of depositing an insulating material, depositing a conductive material, and patterning the deposited materials by photolithography may be performed a plurality of times to form the first signal wiring layer 135. Depositing processes as described herein may include a chemical vapor deposition (CVD) process, an atomic layer deposition (ALD) process, and/or a physical vapor deposition (PVD) process such as a sputtering method.

Since the conductive elements of the wiring pattern P1, for example, a metal material, interfere with a light path, the wiring pattern P1 may be designed such that a region of the wiring pattern P1 in which the arrangement density of the conductive elements is relatively high may be located between adjacent visible light sensing elements SE1.

Figure 14C:
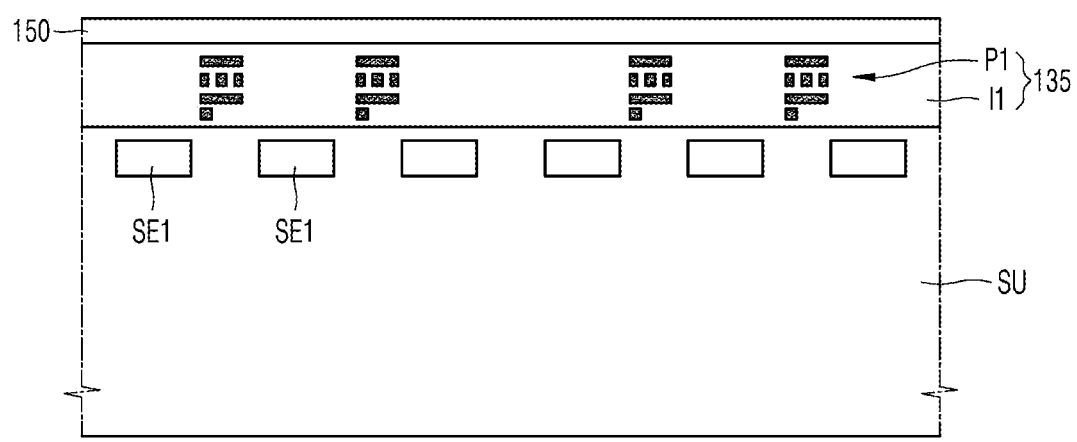
Figure 14C:
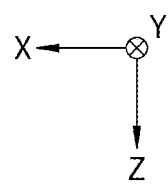

Next, as shown in FIG. 14C, a bandpass filter 150 may be formed. The bandpass filter 150 is a filter configured to transmit light only in an infrared band. However, the process of forming the bandpass filter 150 may be omitted.

Figure 14D:
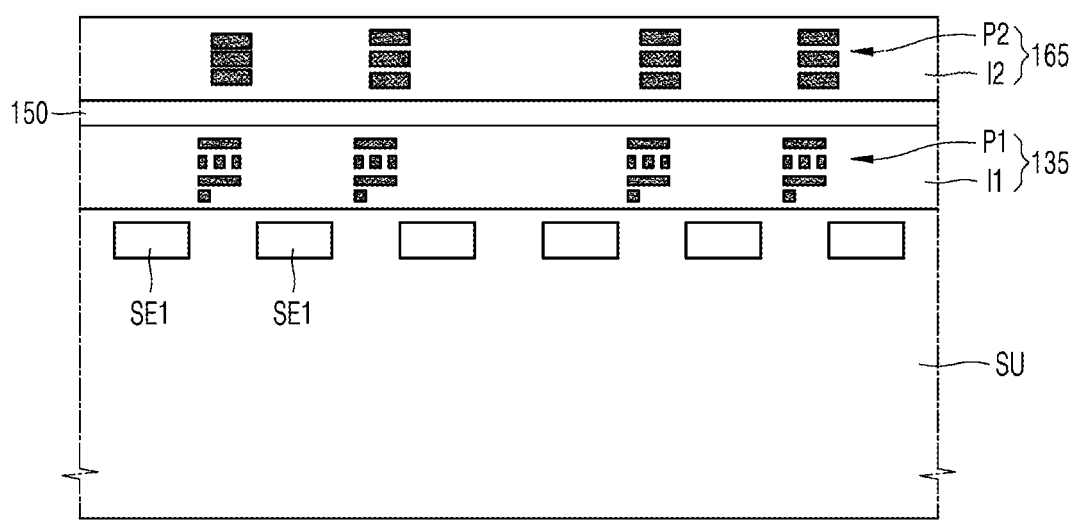

Next, as shown in FIG. 14D, a second signal wiring layer 165 is formed. The second signal wiring layer 165 includes a wiring pattern P2 and an insulating layer 12 and is for reading and processing signals from infrared sensing elements to be formed on the second signal wiring layer 165.

Since conductive elements included in the wiring pattern P2 obstructs a light propagation path, the wiring pattern P2 may be designed to reduce such obstruction in such a manner that a region of the wiring pattern P2 in which the arrangement density of the conductive elements is relatively high may face a region of the first signal wiring layer 135 in which the arrangement density of conductive elements is relatively high.

A process of depositing an insulating material, depositing a conductive material, and patterning the deposited materials by photolithography may be performed a plurality of times on the bandpass filter 150 to form the second signal wiring layer 165.

Figure 14E:
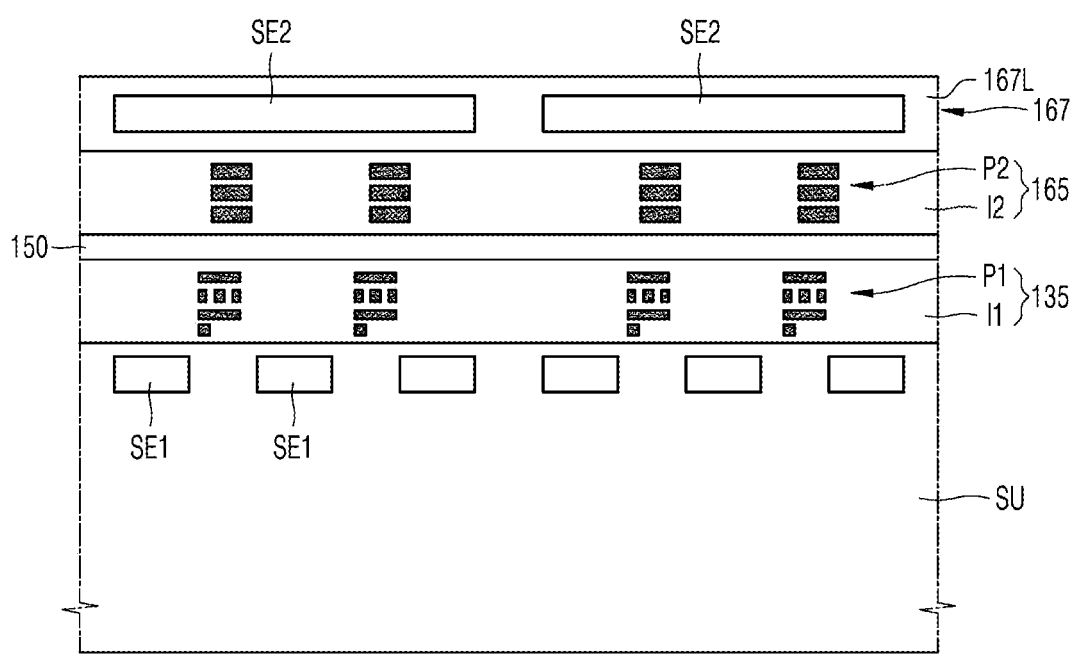

Next, as shown in FIG. 14E, a second sensor layer 167 including a plurality of infrared sensing elements SE2 is formed. The second sensor layer 167 may include the plurality of infrared sensing elements SE2 in a layer material 167L.

Each of the infrared sensing elements SE2 includes a photoelectric conversion material which absorbs and/or converts infrared light into an electrical signal (e.g., photoelectric conversion). The photoelectric conversion material may include various kinds of organic and inorganic materials.

In FIG. 14E, one infrared sensing element SE2 corresponds to (e.g., vertically overlaps in the Z direction, which may be perpendicular to the surface SUS) three visible light sensing elements SE1. However, this is a non-limiting example. The processes in FIGS. 14D and 14E may collectively be referred to as forming an infrared sensor portion 160 on the first signal wiring layer 135. The processes described with reference to FIGS. 14D and 14E may be performed in a series of continuous processes with respect to the semiconductor substrate SU. For example, the process of depositing an insulating and/or conductive material to form the layer material 167L, and forming the light sensing elements SE2 may be performed a plurality of times to form the second sensor layer 167.

In some example embodiments, the forming of the infrared sensor portion 160 is performed through a deposition process and a photolithography process without performing a bonding process (e.g., without adhering the infrared sensor portion 160 to the bandpass filter 150 and/or first signal wiring layer 135.

Figure 14F:
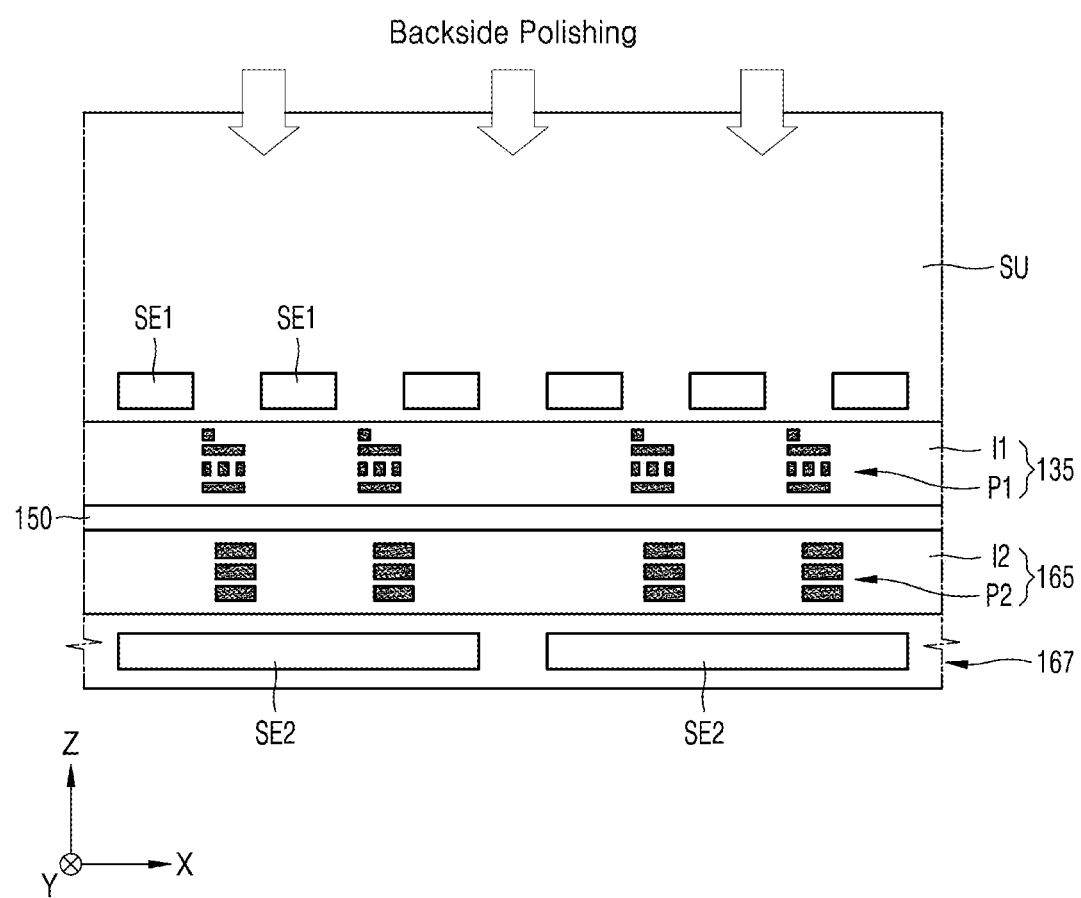

Next, as shown in FIG. 14F, a backside polishing process is performed. In this process, the structure shown in FIG. 14E is turned upside down (e.g., inverted), and a portion of the semiconductor substrate SU is removed. For example, a chemical mechanical polishing (CMP) method or the like may be used.

Figure 14G:
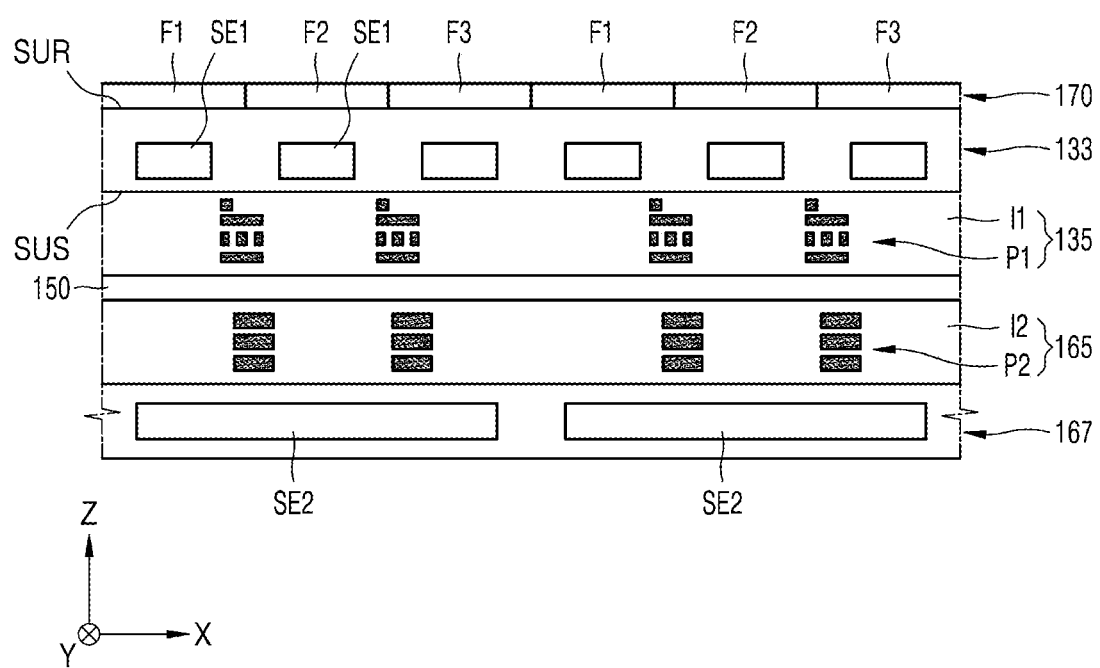

Next, as shown in FIG. 14G, a filter array 170 is formed on a first sensor layer 133.

The filter array 170 includes first filters F1, second filters F2, and third filters F3, and each of the first filters F1, the second filters F2, and the third filters F3 is a dual bandpass filter configured to transmit light in a visible wavelength band and an infrared band. Such a filter array 170, which may include one or more bandpass filters, may be understood to be formed on a rear surfaces SUR of the semiconductor substrate SU, where the rear surface SUR is opposite the surface SUS of the semiconductor substrate SU.

The first filters F1, the second filters F2, and the third filters F3 are arranged to respectively face the visible light sensing elements SE1, and define red subpixels, green subpixels, and blue subpixels.

Figure 14H:
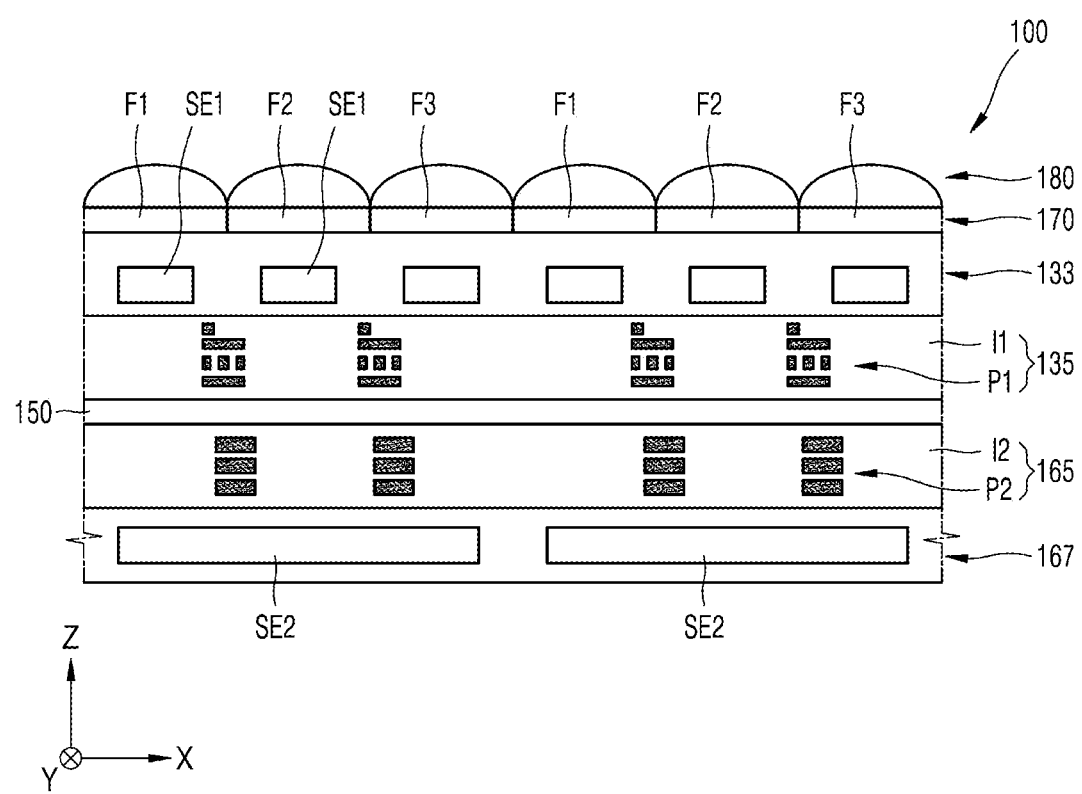

Next, as shown in FIG. 14H, a microlens array 180 is formed on the filter array 170.

The above-described processes of manufacturing an image sensor 100 are sequentially performed based on one semiconductor substrate SU without a process for attaching a structure fabricated through a separate process, and thus the resulting image sensor 100 is a single (e.g., substrate-based) monolithic structure.

In general, an image sensor including an infrared sensor portion and a visible light sensor portion is manufactured by separately fabricating the infrared sensor portion and the visible light sensor portion and bonding the infrared sensor portion and the visible light sensor portion to each other, and to this end, a bonding pad having through-holes for unit pixels is used for pixel alignment. However, this structure complicates manufacturing processes as the number of pixels increases, and it may be difficult to use the structure when the number of pixels is equal to or greater than a certain value.

The method of manufacturing an image sensor that is a single (e.g., substrate-based) monolithic structure according to some example embodiments does not require the formation of through-holes and a bonding pad for alignment, and thus may be structurally distinguished from image sensors including an infrared sensor portion and a visible light sensor portion that are manufactured by separately fabricating the infrared sensor portion and the visible light sensor portion and bonding the infrared sensor portion and the visible light sensor portion to each other, and thus are not a single (e.g., substrate-based) monolithic structure, by the absence of through-holes and a bonding pad for alignment in the image sensor between the visible light sensor portion and the infrared light sensor portion. The method of manufacturing an image sensor that is a single (e.g., substrate-based) monolithic structure according to some example embodiments may thus be effectively used for manufacturing a high-resolution image sensor, as the image sensor that is a single (e.g., substrate-based) monolithic structure may be configured to generate images with higher resolution based on not including through-holes through any part of the visible light sensor portion and/or the infrared light sensor portion, and/or a bonding pad for alignment between the visible the visible light sensor portion and the infrared light sensor portion.

The method of manufacturing an image sensor has been illustrated in FIGS. 14A to 14H and described based on the image sensor 100 shown in FIG. 1, but may also be used for manufacturing the image sensors 101, 102, 103, 104, 105, and 106 of some example embodiments, for example based on changing the order of the processes shown and described in relation to FIGS. 14A to 14H (and/or omitting or adding one or more processes from the method).

As described above, according to the one or more of the above embodiments, the image sensors have a structure in which an infrared sensor and a visible light sensor are integrated with each other (e.g., are included in, define, and/or form a single (e.g., substrate-based) monolithic structure) and are capable of obtaining color image information and infrared image information from an object.

The image sensors may be employed in various electronic devices which are capable of using signals output from an infrared sensor and signals output from a visible light sensor.

According to the method of manufacturing an image sensor, an infrared sensor portion and a visible light sensor portion may be formed in a single (e.g., substrate-based) monolithic structure without requiring an additional structure for alignment, and thus, the image sensor may be effective in realizing high-resolution devices.

While image sensors, electronic devices including the image sensors, and methods of manufacturing the image sensors have been described according to embodiments with reference to the accompanying drawings, these are merely examples, and those of ordinary skill in the art will understand that various modifications and equivalent example embodiments may be made therefrom. Although many items have been stated in the above description, these should be considered as specific examples and should not be considered as limiting the scope of the present disclosure. Thus, the scope and spirit of the present disclosure should be defined not by the descriptions of the example embodiments but by the appended claims.

It should be understood that some example embodiments described herein should be considered in a descriptive sense only and not for purposes of limitation. Descriptions of features or aspects within each example embodiment should typically be considered as available for other similar features or aspects in some example embodiments. While some example embodiments have been described with reference to the figures, it will be understood by those of ordinary skill in the art that various changes in form and details may be made therein without departing from the spirit and scope as defined by the following claims.

What is claimed is:

1. An image sensor, comprising: a visible light sensor including a first sensor layer and a first signal wiring layer, wherein a plurality of visible light sensing elements are arrayed in the first sensor layer and the first signal wiring layer is configured to process a signal output from the first sensor layer; and an infrared sensor on the visible light sensor, the infrared sensor including a second sensor layer and a second signal wiring layer, wherein a plurality of infrared sensing elements are arrayed in the second sensor layer and the second signal wiring layer is configured to process a signal output from the second sensor layer, wherein the infrared sensor and the visible light sensor form a single monolithic structure such that the visible light sensor includes a semiconductor substrate and the infrared sensor is on a surface of the semiconductor substrate, the visible light sensor and the infrared sensor collectively include no more than one semiconductor substrate, and the visible light sensor and infrared sensor do not include through-holes or bonding pads between the visible light sensor and the infrared sensor.

2. The image sensor of claim 1, wherein the visible light sensor and the infrared sensor are arranged such that incident light enters the second sensor layer after passing through the first sensor layer.

3. The image sensor of claim 2, wherein the visible light sensor is arranged such that the incident light enters the first sensor layer before reaching the first signal wiring layer.

4. The image sensor of claim 3, wherein the infrared sensor is arranged such that the incident light enters the second sensor layer after passing through the second signal wiring layer.

5. The image sensor of claim 1, wherein
the first signal wiring layer includes a first wiring pattern that further includes first conductive elements,
the first signal wiring layer includes
 a first high-density region in which a first portion of the first conductive elements are arranged in a first density, and
 a first low-density region in which a second portion of the first conductive elements are arranged in a second density, the second density being lower than the first density, and
in the first wiring pattern of the first signal wiring layer, the first high-density region vertically overlaps with an adjacent region between horizontally-adjacent visible light sensing elements of the plurality of visible light sensing elements.

6. The image sensor of claim 5, wherein
the second signal wiring layer includes a second wiring pattern further including second conductive elements,
the second signal wiring layer includes
 a second high-density region in which a first portion of the second conductive elements are arranged in a third density, and
 a second low-density region in which a second portion of the second conductive elements are arranged in a fourth density, the fourth density being lower than the third density, and
in the second wiring pattern of the second signal wiring layer, the second high-density region of the second signal wiring layer vertically overlaps with the first high-density region of the first signal wiring layer.

7. The image sensor of claim 1, further comprising:
a filter array on the visible light sensor,
wherein the filter array includes first filters configured to selectively transmit red light and infrared light, second filters configured to selectively transmit green light and infrared light, and third filters configured to selectively transmit blue light and infrared light.

8. The image sensor of claim 7, wherein
each filter of the first filters, the second filters, and the third filters vertically overlaps a separate one visible light sensing element of the plurality of visible light sensing elements, and
the first filters, the second filters, and the third filters define a plurality of subpixels.

9. The image sensor of claim 8, wherein the plurality of infrared sensing elements are arranged such that the plurality of infrared sensing elements vertically overlap the plurality of subpixels in a one-to-one manner.

10. The image sensor of claim 8, wherein the plurality of subpixels are arranged in such a manner that a red subpixel, a green subpixel, and a blue subpixel form one unit pixel.

11. The image sensor of claim 10, wherein the plurality of infrared sensing elements are arranged such that one infrared sensing element of the plurality of infrared sensing elements vertically overlaps the one unit pixel.

12. The image sensor of claim 8, wherein the plurality of subpixels are arranged in such a manner that four quadrant regions of one unit pixel are a red subpixel, a first green subpixel, a blue subpixel, and a second green subpixel, respectively.

13. The image sensor of claim 12, wherein the plurality of infrared sensing elements are arranged in such a manner that one infrared sensing element vertically overlaps the one unit pixel.

14. An electronic device, comprising:
the image sensor of claim 1, wherein the image sensor is configured to absorb incident light reflected from an object and output a signal based on the absorbing; and
processing circuitry configured to generate an image of the object based on processing the signal output from the image sensor.

15. The electronic device of claim 14, wherein
the incident light reflected from the object includes infrared incident light and visible incident light,
the visible light sensor is configured to output a visible light signal based on absorbing the visible incident light, the infrared sensor is configured to output an infrared light signal based on absorbing the infrared incident light, and the processing circuitry is further configured to calculate depth information associated with the object based on processing the infrared light signal and combine the depth information with visible light image information about the object that is determined based on processing the visible light signal to generate a 3D image of the object.

16. The electronic device of claim 15, wherein the processing circuitry is further configured to calculate a temperature or moisture distribution of the object based on processing the infrared light signal.

17. A method of manufacturing an image sensor, the method comprising: forming a visible light sensor, the forming of the visible light sensor including, forming a plurality of visible light sensing elements on or at least partially within a semiconductor substrate, and forming a first signal wiring layer on a surface of the semiconductor substrate, the first signal wiring layer being configured to process signals output from the plurality of visible light sensing elements; forming an infrared sensor on the visible light sensor, the forming of the infrared sensor including, forming an infrared sensor layer including a plurality of infrared sensing elements, and forming a second signal wiring layer configured to process signals output from the plurality of infrared sensing elements; and forming a filter array on a rear surface of the semiconductor substrate, the rear surface being opposite to the surface of the semiconductor substrate, wherein the forming of the visible light sensor and the forming of the infrared sensor on the visible light sensor are collectively performed in a series of continuous processes with respect to the semiconductor substrate, the series of continuous processes including a plurality of deposition processes and a plurality of photolithography processes without performing a bonding or adhesion process.

18. The method of claim 17, wherein
the forming of the first signal wiring layer includes
forming a first wiring pattern that further includes first conductive elements,
the first signal wiring layer includes
a first high-density region in which a first portion of the first conductive elements are arranged in a first density, and
a first low-density region in which a second portion of the first conductive elements are arranged in a second density, the second density being lower than the first density, and
in the first wiring pattern of the first signal wiring layer, the first high-density region vertically overlaps with an adjacent region between horizontally-adjacent visible light sensing elements of the plurality of visible light sensing elements.

19. The method of claim 18, wherein
the forming of the second signal wiring layer includes
forming a second wiring pattern further including second conductive elements,
the second signal wiring layer includes
a second high-density region in which a first portion of the second conductive elements are arranged in a third density, and
a second low-density region in which a second portion of the second conductive elements are arranged in a fourth density, the fourth density being lower than the third density, and
in the second wiring pattern of the second signal wiring layer, the second high-density region of the second signal wiring layer vertically overlaps with the first high-density region of the first signal wiring layer.

20. The method of claim 17, wherein the filter array comprises:
first filters configured to selectively transmit red light and infrared light, second filters configured to selectively transmit green light and infrared light, and third filters configured to selectively transmit blue light and infrared light,
wherein each filter of the first filters, the second filters, and the third filters vertically overlaps a separate one visible light sensing element of the plurality of visible light sensing elements,
wherein the first filters, the second filters, and the third filters define a plurality of subpixels.

21. The method of claim 20, wherein the plurality of subpixels are arranged in such a manner that four quadrant regions of one unit pixel are a red subpixel, a first green subpixel, a blue subpixel, and a second green subpixel, respectively.

22. The method of claim 21, wherein the plurality of infrared sensing elements are arranged in such a manner that one infrared sensing element vertically overlaps the one unit pixel, such that the one infrared sensing element vertically overlaps each of the red subpixel, the first green subpixel, the blue subpixel, and the second green subpixel.

23. The method of claim 21, wherein the plurality of infrared sensing elements are arranged in such a manner that separate, respective infrared sensing element vertically overlap separate, respective subpixels of the red subpixel, the first green subpixel, the blue subpixel, and the second green subpixel.

* * * * *